United States Patent
Rudell et al.

(10) Patent No.: US 7,349,679 B1
(45) Date of Patent: Mar. 25, 2008

(54) INTEGRATED POWER AMPLIFIER

(75) Inventors: Jacques Rudell, San Jose, CA (US);
Beomsup Kim, Cupertino, CA (US)

(73) Assignee: Qualcomm Inc., San Diego, CA (US)

( * ) Notice: Subject to any disclaimer, the term of this patent is extended or adjusted under 35 U.S.C. 154(b) by 436 days.

(21) Appl. No.: 10/881,428

(22) Filed: Jun. 30, 2004

(51) Int. Cl.
*H04B 1/16* (2006.01)

(52) U.S. Cl. .............. 455/209; 455/211; 455/259; 330/297

(58) Field of Classification Search ............ 455/95, 455/205, 208, 209, 210, 211, 255, 257, 258, 455/259, 84–87, 256, 341; 330/124, 127, 330/129, 136, 297
See application file for complete search history.

(56) References Cited

U.S. PATENT DOCUMENTS

| | | | |
|---|---|---|---|
| 4,940,939 A | 7/1990 | Khait et al. ............ | 324/236 |
| 5,426,395 A | 6/1995 | Cygan .................. | 330/207 P |
| 5,694,433 A | 12/1997 | Dent ..................... | 375/297 |
| 6,043,707 A | 3/2000 | Budnik ................. | 330/10 |
| 6,285,251 B1 * | 9/2001 | Dent et al. ............ | 330/127 |
| 6,430,213 B1 | 8/2002 | Dafesh ................ | 375/146 |
| 6,631,254 B1 | 10/2003 | Wilson et al. ........ | 455/91 |
| 6,724,267 B2 | 4/2004 | Kim ..................... | 331/57 |
| 6,996,379 B2 * | 2/2006 | Khorram .............. | 455/91 |
| 7,110,727 B2 * | 9/2006 | Dekker ................ | 455/91 |
| 2003/0048834 A1 * | 3/2003 | Feher ................... | 375/219 |
| 2004/0102176 A1 * | 5/2004 | Hayashi et al. ....... | 455/333 |
| 2004/0266365 A1 * | 12/2004 | Hasson et al. ........ | 455/91 |

OTHER PUBLICATIONS

"Nonlinear Amplifier Effects in Communications Systems", Liang et al., IEEE Trans. on Microwave Theory and Techniques, vol. 47, No. 8, Aug. 1999, pp. 1461-1466.

"RF Power Control in GSM Systems for Constant and Non Constant Envelope Modulation Schemes," Becker, et al., Proc. of 2003 Int'l Symp. on Circuits and Sys., ISCAS Mar. 2003, vol. 3, pp. III-602 to III-605.

* cited by examiner

*Primary Examiner*—Edward F. Urban
*Assistant Examiner*—Nhan T. Le
(74) *Attorney, Agent, or Firm*—Saile Ackerman LLC; Stephen B. Ackerman; Billy Knowles

(57) ABSTRACT

A power amplifier develops a modulated high power signal by summing the outputs of multiple voltage controlled oscillators. A phase control circuit synchronizes the phase relationship of multiple voltage controlled oscillators. The voltage control oscillators provide amplitude modulation of an output signal of the voltage controlled oscillator by adjusting transconductance of amplification devices of the voltage controlled oscillator. Another embodiment of the power amplifier provides buffer circuits at the outputs of the voltage controlled oscillators. The gain or delay of the buffer circuits is varied to provide amplitude modulation of the power amplifier.

99 Claims, 7 Drawing Sheets

INTEGRATED POWER AMPLIFIER

BACKGROUND OF THE INVENTION

1. Field of the Invention

This invention relates generally to electronic amplifier circuits. More particularly, this invention relates to voltage controlled oscillator circuits applied to modulation and amplification functions within radio frequency wireless transmitting equipment.

2. Description of Related Art

As is well known in the art, voltage controlled oscillators are oscillating circuits with a control input signal (current or voltage) that controls the frequency of the output signal of the voltage controlled oscillator. In wireless radio frequency transmission applications the control input signal is used to modulate the phase or frequency of the fundamental frequency of a transmitted signal. Once the frequency is modulated, it is amplified for transmission to a receiver. The amplification is sufficient to overcome signal loss during transmission through a medium, such as the atmosphere, between the transmitting and receiving antennas.

In radio frequency communication, there are three fundamental types of modulation of a fundamental signal for the transmission of intelligence between a transmitter and a receiver. The three types are amplitude modulation where the amplitude of the fundamental signal is changed with the amplitude of the information being transmitted; frequency modulation where the frequency of the fundamental signal is varied with the information; and phase modulation where a phase angle of the fundamental signal is varied with the information being transmitted.

The information may be analog information representing speech, video, or other directly measured data. Alternately, the information may be digital data. In the case of digital data, the digital data representing "1's" and "0's" modulate the signal as amplitude, phase, or frequency shift keying. This further leads to more complex modulation schemes representing symbol codes as different states of the keying signal.

Amplitude and phase modulation such as quadrature amplitude modulation (QAM) and phase shift keying (PSK) are non-constant envelope techniques that provide high spectral efficiency, but require linear amplifiers. Linear amplifiers are known in the art and are classified as A, AB, and B. Class A amplifiers have the highest spectral purity and limit out-of-band emissions.

"Nonlinear Amplifier Effects in Communications Systems," Liang et al., IEEE Transactions on Microwave Theory and Techniques, VOL. 47, NO. 8, August 1999, pp: 1461-1466, investigates Class-AB amplifiers with a variety of modulation schemes such as non-constant envelope modulation. Liang et al. further describe that when non-constant envelope signals are passed through an amplifier, the amplifier produces both in-band and adjacent channel signals not present in the input waveform, which are a source of interference. An advantage of non-constant envelope signals is their band-limited nature before nonlinear amplification. At modest drive levels in the linear region of the amplifier, there is little spill over of the output signal into the neighboring channels. These tradeoffs under different operating conditions help determine the energy performance of the amplifier modulation combination.

"RF Power Control in GSM Systems for Constant and Non Constant Envelope Modulation Schemes," Becker et al., Proceedings of the 2003 International Symposium on Circuits and Systems, ISCAS '03, 2003, Volume: 3, pp: III-602-III-605 vol. 3 describes a potential set-up that enables proper control of the output power $P_{OUT}$ of an amplifier in presence of magnitude modulation during bursts and supports ramping-up and -down for both GMSK and 8PSK modulation schemes.

U.S. Pat. No. 6,430,213 (Dafesh) describes a generalized quadrature product subcarrier modulation system that applies subcarrier modulation to quadrature modulated signals with constant envelope modulation suitable for efficient sinewave and squarewave subcarrier modulations. The quadrature subcarrier modulation enables the addition of new signals to the in-phase and quadrature phase signals with spectral isolation while maintaining a constant amplitude waveform. The generalized quadrature product subcarrier modulation applies subcarrier modulation to quadrature-multiplexed communication systems without the need to employ non-constant envelope modulation subject to amplitude modulation to amplitude modulation, and amplitude modulation to phase modulation distortions through a non-linear high power amplifier.

U.S. Pat. No. 6,043,707 (Budnik) illustrates a variable-class linear amplifier that applies a supply type of envelope modulation to an RF power amplifier operating in or near compression at highest envelope amplitudes and transitions gradually to an envelope tracking type of operation at intermediate envelope amplitudes. The amplifier further transitions gradually to a linear class of operation with a constant supply voltage at lowest envelope amplitudes.

U.S. Pat. No. 5,694,433 (Dent) teaches efficient linear power amplification for communications with reduced adjacent channel energy. The amplification involves generating a first signal with the undesired amount of adjacent channel energy and generating a second signal corresponding to the undesired amount of adjacent channel energy. The second signal is subtracted from the first signal to remove the undesired amount of adjacent channel energy.

U.S. Pat. No. 5,426,395 (Cygan) describes power amplifiers that include a feedback element that may be protected from excessive operating power levels by adjusting the feedback element to reduce the drive signals to the power elements. This is accomplished by sensing the output power of the power amplifier to produce a sensing signal. When the sensing signal exceeds a predetermined threshold, a feedback element is adjusted to produce an increased feedback signal. The increased feedback signal is subtracted from an input signal, thus decreasing the drive signal. With the drive signal reduced, the output power is reduced proportionally to the adjustment of the feedback element.

U.S. Pat. No. 6,631,254 (Wilson, et al.) illustrates a radio frequency amplifier using an offset phase locked loop to produce a radio frequency signal from a baseband signal. In order to allow the phase locked loop to process the signal as one of constant amplitude, the signal is amplitude limited prior to application to the phase comparator, and envelope restoration is achieved by envelope-modulating the output in the RF power amplifier stage.

SUMMARY OF THE INVENTION

An object of this invention is to provide a modulator and power amplifier employing voltage controlled oscillators.

Another object of this invention is to provide a modulator and power amplifier where the outputs of multiple voltage controlled oscillators are summed to provide necessary amplification of the modulated radio frequency signals for transmission through a medium such as the atmosphere.

A further object of this invention is to provide a phase control circuit to synchronize the phase relationship of multiple voltage controlled oscillators.

Further still another object of this invention is to provide a voltage control oscillator with amplitude modulation of an output signal of the voltage controlled oscillator.

An even further object of this invention is to provide a modulator and power amplifier where outputs of a voltage controlled oscillator are summed in a summing circuit and the output signal amplitude is modulated by adjusting the gain of a buffer circuit between the voltage controlled oscillator and the summing circuit.

Again a still further object of this invention is to provide a modulator and power amplifier where outputs of a voltage controlled oscillator are summed in a summing circuit and the output signal amplitude is modulated by adjusting a delay factor of a buffer circuit between the voltage controlled oscillator and the summing circuit.

To accomplish at least one of these objects, a power amplifier that provides a high power output signal has at least one voltage controlled oscillator. Each of the voltage controlled oscillator has an input control signal terminal that receives an input control signal and a first output signal terminal. The first output terminal transmits a first output signal such that the input control signal adjusts a frequency for the first output signal.

If there are multiple voltage controlled oscillators, a phase control port receives and transmits a phase control signal. A phase control circuit is in communication with the phase control port of each of the voltage controlled oscillators to propagate the phase control signals to and from each voltage controlled oscillators such that each of the plurality of voltage controlled oscillators has an identical phasing of the first output signal.

The power amplifier has a plurality of first buffer circuits. Each first buffer circuit has an input terminal and an output terminal. The input terminal receives the first output signal from one voltage controlled oscillator. The buffer circuit amplifies and conditions the first output signal from one voltage controlled oscillator and transmits the amplified and conditioned first output signal from the output terminal.

A signal combining circuit is in communication with the buffer circuits to receive the amplified and conditioned first output signals. The signal combining circuit combines the amplified and conditioned first signals to generate the high power output signal.

The voltage controlled oscillators further include a second output terminal to transmit a second output signal. The input control signal adjusts the frequency of the first and second output signals and the phase control circuit propagates the phase control signals such that each of the voltage controlled oscillators has an identical phasing of the first and second output signals.

The second output terminals are connected to a plurality of second buffer circuits. Each second buffer circuit comprising an input terminal and an output terminal. The input terminal receives the second output signal from one voltage controlled oscillator, the buffer circuit amplifies and conditions the second output signal from one voltage controlled oscillator and transmits the amplified and conditioned second output signal from the output terminal.

The signal combining circuit is in communication with the first buffer circuits and the second buffer circuits to receive the amplified and conditioned first and second output signals. The signal combining circuit then combines the amplified and conditioned first and second output signals to generate the high power output signal.

In a first embodiment of the power amplifier, each voltage controlled oscillator has four transistors and a frequency determining device such as a parallel inductive/capacitive reactive circuit. A first transistor has a source connected to the first output signal terminal, a gate, and a drain connected to a first power supply voltage source. A second transistor has a source connected to the second output signal terminal and the gate of the first transistor, a gate connected to the source of the first transistor, and a drain connected to the first power supply voltage source. The frequency determining element, which governs the fundamental frequency of each voltage controlled oscillator, is connected between the source of the first transistor and the source of the second transistor. The third transistor has a drain connected to first output terminal, a gate, and a source connected to a second power supply voltage source. The fourth transistor has a drain connected to second output terminal, a gate, and a source connected to the second power supply voltage source. The input control signal sets a conductance of the third and fourth transistors to control the frequency of the first and second output signals to provide a phase/frequency modulation of the first and second output signals.

If there is only a single voltage controlled oscillator implemented in the power amplifier, the gates of the third and fourth transistors are connected to the input control signal terminal. For multiple voltage controlled oscillators with a synchronized phase output signals of the voltage controlled oscillators, the phase control circuit comprises a plurality of buffer amplifiers. Each buffer amplifier includes an input terminal and an output terminal such that a signal presented to the input terminal is transferred to the output terminal. A pair of the plurality of voltage controlled oscillators has four of the plurality of buffer amplifiers installed between them. The first buffer amplifier of the four buffer amplifiers has its input terminal connected to the first output terminal of a first of the pair of voltage controlled oscillators. The output of the first buffer amplifier is connected to the gate of the third transistor of a second voltage controlled oscillator of the pair of voltage controlled oscillators. The second buffer amplifier of the four buffer amplifiers has its input terminal connected to the first output terminal of the second of the pair of voltage controlled oscillators and the output of the second buffer amplifier is connected to the gate of the third transistor of a first voltage controlled oscillator of the pair of voltage controlled oscillators. The third buffer amplifier of the four buffer amplifiers has its input terminal connected to the second output terminal of the first of the pair of voltage controlled oscillators and the output of the third buffer amplifier is connected to the gate of the fourth transistor of the second voltage controlled oscillator of the pair of voltage controlled oscillators. The fourth buffer amplifier of the four buffer amplifiers has its input terminal connected to the second output terminal of the second voltage controlled oscillator of the pair of voltage controlled oscillators and the output of the second buffer amplifier is connected to the gate of the fourth transistor of a first voltage controlled oscillator of the pair of voltage controlled oscillators.

The input control signal terminal of a master voltage controlled oscillator of the plurality of voltage controlled oscillators is connected to the gates of the third and fourth transistors of the master voltage controlled oscillator to provide control signals to control the phase/frequency of the master voltage controlled oscillator and thus the phase of the plurality of voltage controlled oscillators.

In a second embodiment of the power amplifier, each voltage controlled oscillator has four amplification devices and a frequency determining device such as a parallel inductive/capacitive reactive circuit. A first amplification device has a source terminal connected to the first output signal terminal, a gate terminal, and a drain terminal connected to a first power supply voltage source terminal. A second amplification device has a source terminal connected to the second output signal terminal and the gate terminal of the first amplification device, a gate terminal connected to the source terminal of the first amplification device, and a drain terminal connected to the first power supply voltage source terminal. The frequency determining element, which governs the fundamental frequency of each voltage controlled oscillator, is connected between the source terminal of the first amplification device and the source terminal of the second amplification device. The third amplification device has a drain terminal connected to first output terminal, a gate terminal, and a source terminal connected to a second power supply voltage source terminal. The fourth amplification device has a drain terminal connected to second output terminal, a gate terminal, and a source terminal connected to the second power supply voltage source terminal. The input control signal sets a conductance of the third and fourth amplification devices to control the frequency of the first and second output signals to provide a phase/frequency modulation of the first and second output signals.

If there is only a single voltage controlled oscillator implemented in the power amplifier, the gate terminals of the third and fourth amplification devices are connected to the input control signal terminal. For multiple voltage controlled oscillators with a synchronized phase of the output signals of the voltage controlled oscillators, the phase control circuit comprises a plurality of buffer amplifiers. Each buffer amplifier includes an input terminal and an output terminal such that a signal presented to the input terminal is transferred to the output terminal. A pair of the plurality of voltage controlled oscillators has four of the plurality of buffer amplifiers installed between them. The first buffer amplifier of the four buffer amplifiers has its input terminal connected to the first output terminal of a first of the pair of voltage controlled oscillators and the output of the first buffer amplifier is connected to the gate terminal of the third amplification device of a second voltage controlled oscillator of the pair of voltage controlled oscillators. The second buffer amplifier of the four buffer amplifiers has its input terminal connected to the first output terminal of the second of the pair of voltage controlled oscillators and the output of the second buffer amplifier is connected to the gate terminal of the third amplification device of a first voltage controlled oscillator of the pair of voltage controlled oscillators. The third buffer amplifier of the four buffer amplifiers has its input terminal connected to the second output terminal of the first of the pair of voltage controlled oscillators and the output of the third buffer amplifier is connected to the gate terminal of the fourth amplification device of the second voltage controlled oscillator of the pair of voltage controlled oscillators. The fourth buffer amplifier of the four buffer amplifiers has its input terminal connected to the second output terminal of the second voltage controlled oscillator of the pair of voltage controlled oscillators and the output of the second buffer amplifier is connected to the gate terminal of the fourth amplification device of a first voltage controlled oscillator of the pair of voltage controlled oscillators.

The input control signal terminal of a master voltage controlled oscillator of the plurality of voltage controlled oscillators is connected to the gate terminals of the third and fourth amplification devices of the master voltage controlled oscillator to provide control signal to control the phase/frequency of the master voltage controlled oscillator and thus the phase of the plurality of voltage controlled oscillators.

The first and second amplification devices each include a first plurality of parallel transistors, a first plurality of switching devices, and a first modulation control device. Each of the plurality of parallel transistors has a gate connected to the gate terminal, a source connected to the source terminal, and a drain terminal. The first plurality of switching devices has a first terminal connected to the drain terminal, a second terminal connecting the drains of all of the first plurality of parallel transistors excepting a first transistor of the first plurality of parallel transistors, and a control terminal to control the modulation. The drain of the first transistor of the first plurality of parallel transistors is connected to the drain terminal. The first modulation control device is connected to amplitude modulation control terminal to receive the amplitude modulation signal. The first modulation control device then interprets the amplitude modulation signal to selectively activate any of the plurality of switching devices to connect the drains of the selected parallel transistors to the drain terminal and modify the transconductance factor of the first and second amplification devices.

The third and fourth amplification devices each include a second plurality of parallel transistors, a second plurality of switching devices, and a second modulation control device. Each of the plurality of parallel transistors has a gate connected to the gate terminal, a source connected to the source terminal, and a drain. The second plurality of switching devices has a second terminal connected to the drain terminal, a second terminal connecting the drains of all of the second plurality of parallel transistors excepting a second transistor of the second plurality of parallel transistors, and a control terminal to control the modulation. The drain of the second transistor of the second plurality of parallel transistors is connected to the drain terminal. The second modulation control device is connected to the amplitude modulation control terminal to receive the amplitude modulation signal. The second modulation control device then interprets the amplitude modulation signal to selectively activate any of the plurality of switching devices to connect the drains of the selected parallel transistors to the drain terminal and modify the transconductance factor of the third and fourth amplification devices.

A third embodiment of the power amplifier has an amplitude modulation circuit connecting the first power supply voltage source and the pluralities of the first and second buffer circuits to adjust an amplifying factor of the pluralities of the first and second buffer circuits to provide an amplitude modulation of the output signal dependent upon the amplitude modulation signal.

A fourth embodiment of the power amplifier has an amplitude modulation circuit connected to the pluralities of the first and second buffer circuits to adjust a delay factor of the pluralities of the first and second buffer circuits to provide an amplitude modulation of the output signal dependent upon the amplitude modulation signal. Adjusting the delay of the first and second buffer circuits is dependent upon the amplitude of the modulating input signal and thus the high power output signal is determined by the formula:

$$AMS = \cos\theta * \sin\omega t = [\sin(\omega t + \theta) + \sin(\omega t - \theta)]^{1/2}$$

where:
AMS is the amplitude modulated high power output signal.
cos θ is the amplitude of the amplitude modulation signal and θ is the delay factor.
sin ωt is the amplitude of the output signal of each voltage controlled oscillator.

Alternately, the high power output signal is determined by the formula:

$$AMS = \sin\theta * \sin\omega t = [\sin(\omega t + \theta) - \sin(\omega t - \theta)] \cdot \tfrac{1}{2}$$

where:
AMS is the amplitude modulated high power output signal.
sin θ is the amplitude of the amplitude modulation signal and θ is the delay factor.
sin ωt is the amplitude of the output signal of each voltage controlled oscillator.

DETAILED DESCRIPTION OF THE INVENTION

A power amplifier of the present invention provides multiple voltage controlled oscillators. The voltage control lines to the voltage control oscillators provide for a phase/frequency modulation of the frequency of the oscillator's output signal. The amplitude of the oscillators output signal may be modulated by adjusting the transconductance of the transistors of the voltage controlled oscillator. The output signals of the voltage controlled oscillators are applied to buffer amplifiers and then to a signal combining circuit or summing circuit that combines the output signals to generate an amplified high power output signal for transmission to an electrical load. An alternate amplitude modulation of the power amplifier varies the gain or feed current of the transistors of the buffer circuits.

The power amplifier includes a phase synchronizing circuit connected to the voltage controlled oscillators. The phase synchronizing circuit provides phase control signals to and from each of the voltage controlled oscillators to insure that all the output signals of the voltage controlled oscillators are phase synchronized.

Figure 1:
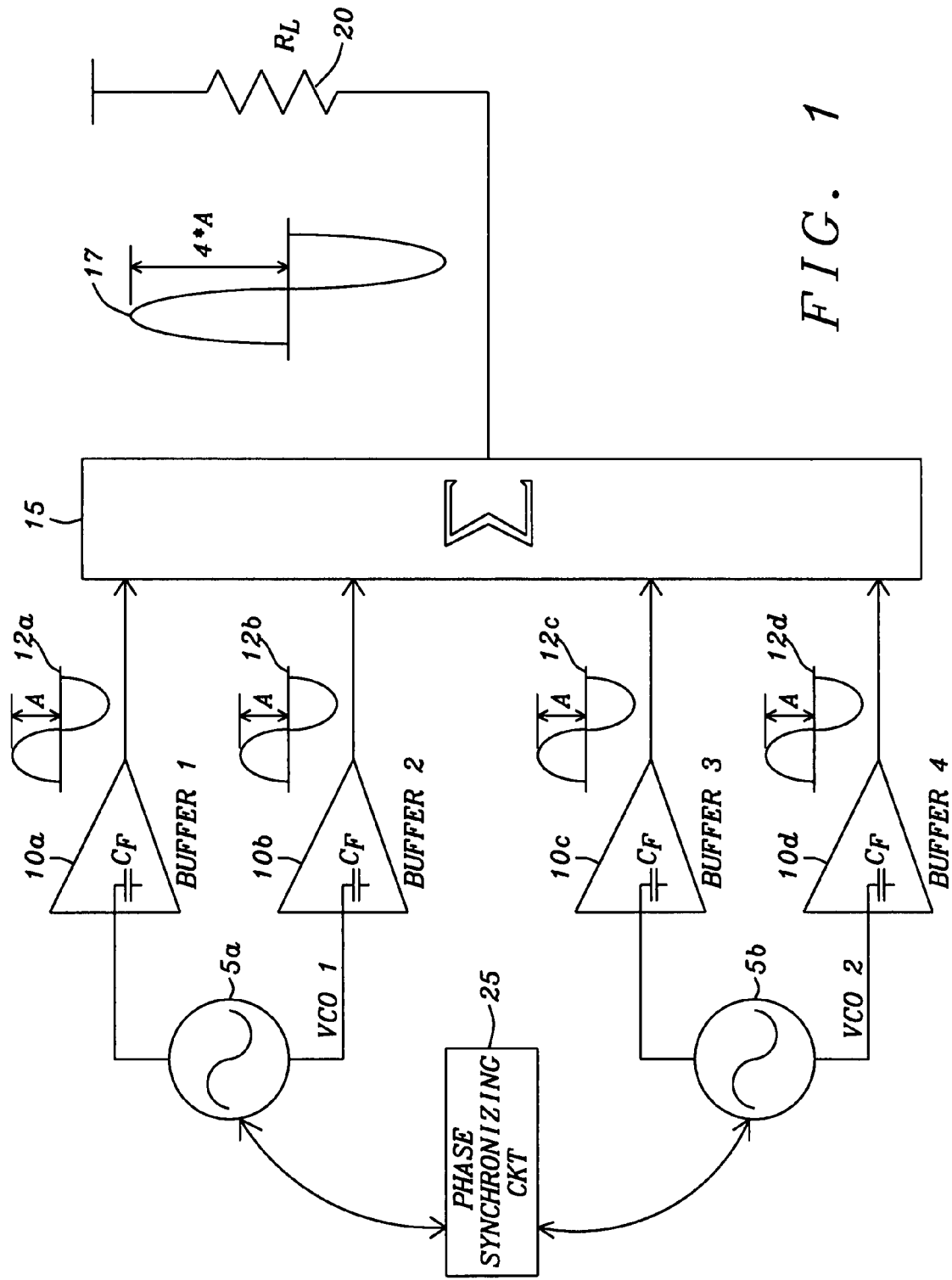
FIG. 1 is a schematic diagram of power amplifier including a voltage controlled oscillator of this invention.

Refer now FIG. 1 for a more detailed description of the power amplifier of this invention. The power amplifier has multiple voltage controlled oscillators 5i a, . . . , 5b. Each voltage controlled oscillators 5a, . . . , 5b has at least one output and generally has two outputs, one out of phase with the other. The outputs of the voltage controlled oscillators 5a, . . . , 5b are connected respectively to the inputs of the buffer amplifiers 10a, . . . , 10d. The buffer amplifiers 10a, . . . , 10d amplify and condition the output signals of the voltage controlled oscillators 5a, . . . , 5b to generate the signals 12a, . . . , 12d, each with an amplitude A.

The signals 12a, . . . , 12d are applied as inputs to the summation combining circuit 15. The signals 12a, . . . , 12d are added together to create the high power output signal 17, which has an amplitude of 4A. The high power output signal 17 is applied to the load circuit 20. In an radio frequency application the load circuit 20 would be an antenna. The amplification factor provided by the power amplifier would be sufficient to overcome the losses of the transmission medium (i.e. the atmosphere).

A phase synchronizing circuit 25 transmits a phase control signal to and from each of the voltage controlled oscillators 5a, . . . , 5b to insure that the output signal of the voltage controlled oscillators 5a, . . . , 5b are all phase synchronized.

Figure 2:
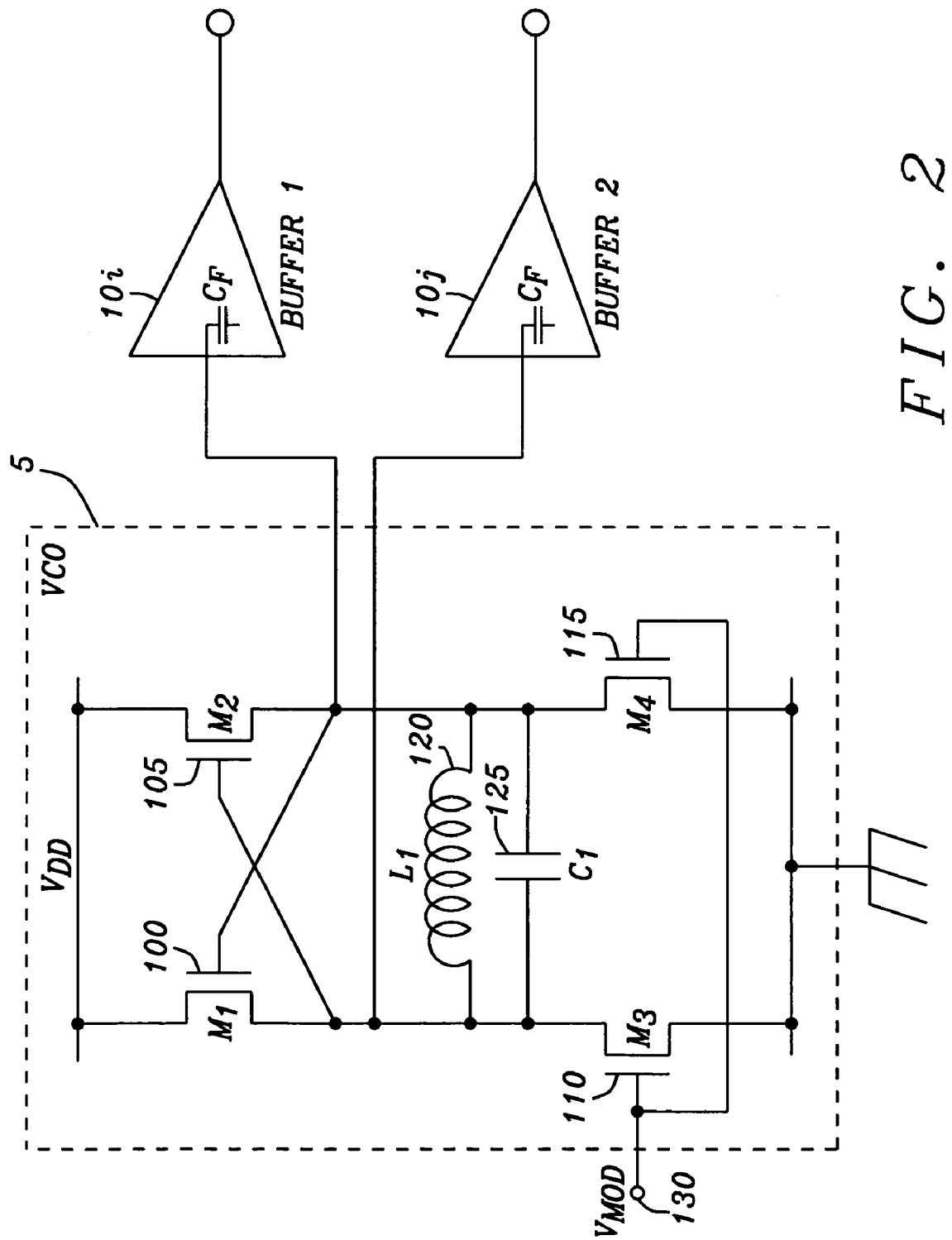
FIG. 2 is a schematic diagram of the voltage controlled oscillator of this invention.

FIG. 2 illustrates the structure of each of the voltage controlled oscillators 5. The voltage controlled oscillators 5 has two transistors $M_1$ (100) and $M_2$ (105) that provide the necessary amplification and feedback to provide oscillation. The drains of the two transistors $M_1$ (100) and $M_2$ (105) are connected to the power supply voltage source $V_{DD}$. The gates of the two transistors $M_1$ (100) and $M_2$ (105) are cross-connected to the opposing sources of the two transistors $M_1$ (100) and $M_2$ (105). The sources of the two transistors $M_1$ (100) and $M_2$ (105) are connected to the output terminals of the voltage controlled oscillator 5.

The inductor $L_1$ (120) and the capacitor $C_1$ (125) form the reactive element that is connected between the sources of the two transistors $M_1$ (100) and $M_2$ (105) and the output terminals of the voltage controlled oscillator 5.

The two transistors $M_3$ (110) and $M_4$ (115) act as loading devices for the voltage controlled oscillator 5. The sources two transistors $M_3$ (110) and $M_4$ (115) are connected to a ground reference point and the drains of the two transistors $M_3$ (110) and $M_4$ (115) are connected to the sources of the two transistors $M_1$ (100) and $M_2$ (105) and the output terminals of the voltage controlled oscillator 5. The gates of the two transistors $M_3$ (110) and $M_4$ (115) are connected to the phase/frequency modulation terminal to receive a phase/frequency modulation signal $V_{MOD}$. The level of the phase/frequency modulation signal $V_{MOD}$ adjusts the currents through the two transistors $M_3$ (110) and $M_4$ (115) and thus the frequency of the voltage controlled oscillator 5.

The output terminals of the voltage controlled oscillator 5 are connected to the buffer amplifiers 10i and 10j. The buffer amplifiers 10i and 10j provide isolation of the voltage controlled oscillators 5 from the summation combining circuit 15 of FIG. 1.

Figure 3:
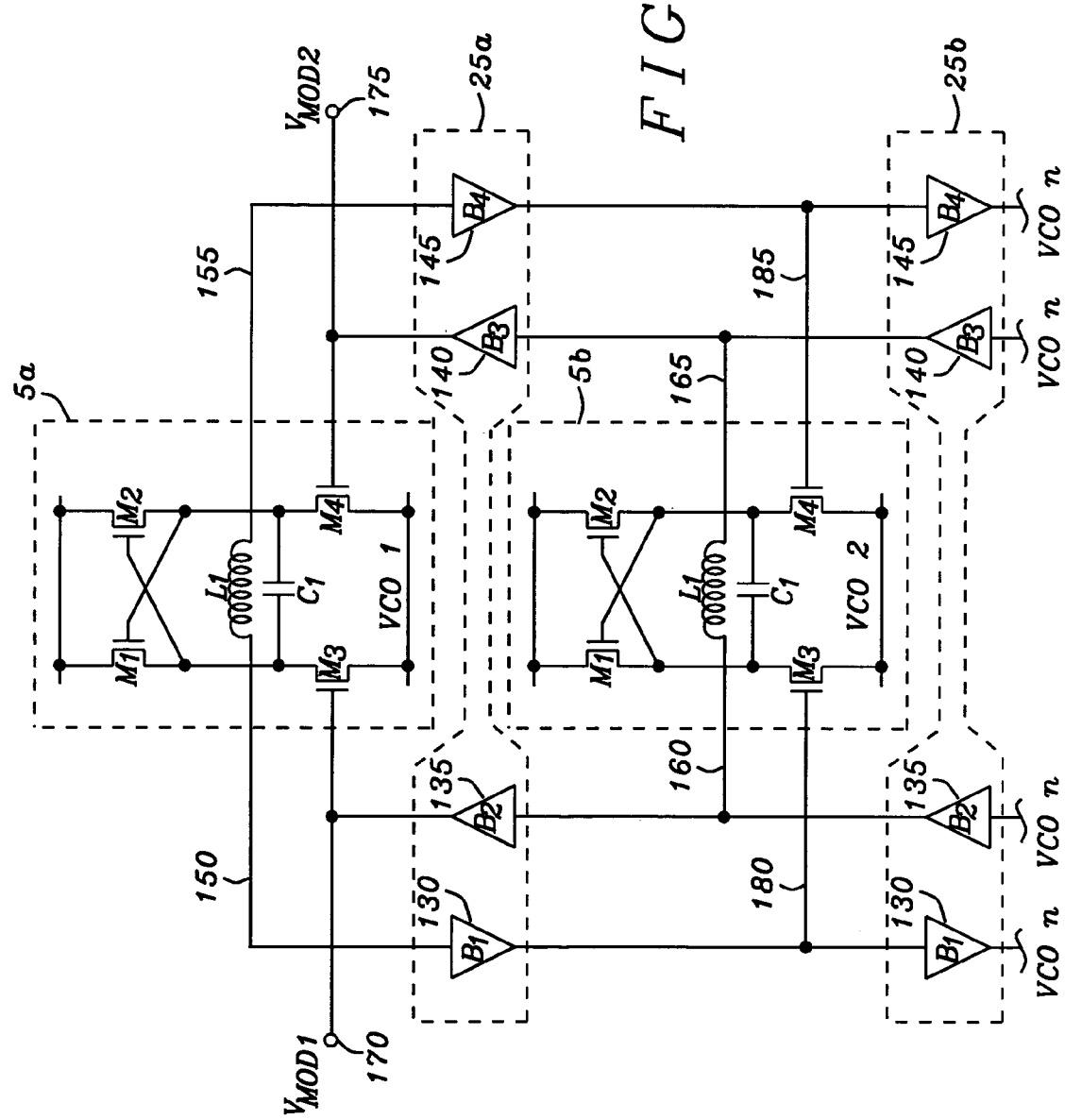
FIG. 3 is a schematic diagram of multiple voltage controlled oscillators phase synchronization of this invention.

Refer now to FIG. 3 for a discussion of the structure and operation of the phase synchronizing circuit 25a. In an embodiment of the power amplifier with two or more voltage controlled oscillators 5a and 5b, the phase synchronization circuit 25a consists of four buffer circuits 130, 135, 140, and 145. The first output 150 of the first voltage controlled oscillator 5a is connected to the input of the first buffer 130. The output of the first buffer 130 is connected to the first phase/frequency modulation control terminal 180 of the second voltage controlled oscillator 5b. The first output 160 of the second voltage controlled oscillator 5b is connected to the input of the second buffer 135. The output of the second buffer 135 is connected to the first phase/ frequency modulation control terminal 170 of the first voltage controlled oscillator 5a. The second output 155 of the first voltage controlled oscillator 5a is connected to the input of the fourth buffer 145. The output of the fourth buffer 145 is connected to the second phase/frequency modulation control terminal 185 of the second voltage controlled oscillator 5b. The second output 165 of the second voltage controlled oscillator 5b is connected to the input of the third buffer 140. The output of the third buffer 140 is connected to the second phase/frequency modulation control terminal 175 of the first voltage controlled oscillator 5a.

The first and second phase/frequency modulation control terminals 170 and 175 of the first or master voltage controlled oscillator 5a are connected to receive a first and second phase frequency modulation signals $V_{MOD1}$ and $V_{MOD2}$ to provide the phase frequency modulation for the multiple voltage controlled oscillators 5a, 5b, . . . . If there are more than two voltage controlled oscillators 5a, 5b, . . . then the phase synchronization circuit 25 is replicated and connected between each pair of voltage controlled oscillators 5a, 5b, . . . to insure that the phase of each voltage controlled oscillator 5a, 5b, . . . is locked to that of the master voltage controlled oscillator 5a, 5b, . . . . The phase synchronization circuit 25 provides a coupling of the voltage controlled oscillators 5a, 5b. . . . Examples of this coupling are shown in U.S. Pat. No. 6,724,267 (Kim) (assigned to the same assignee as this invention) and U.S. Pat. No. 4,940,939 (Khait, et al.). Kim provides a phase synchronization circuit 25 where the voltage controlled oscillators 5a, 5b . . . are electrically coupled. Khait, et al. provides a phase synchronization circuit 25 where the voltage controlled oscillators 5a, 5b . . . are magnetically coupled.

Figure 4:
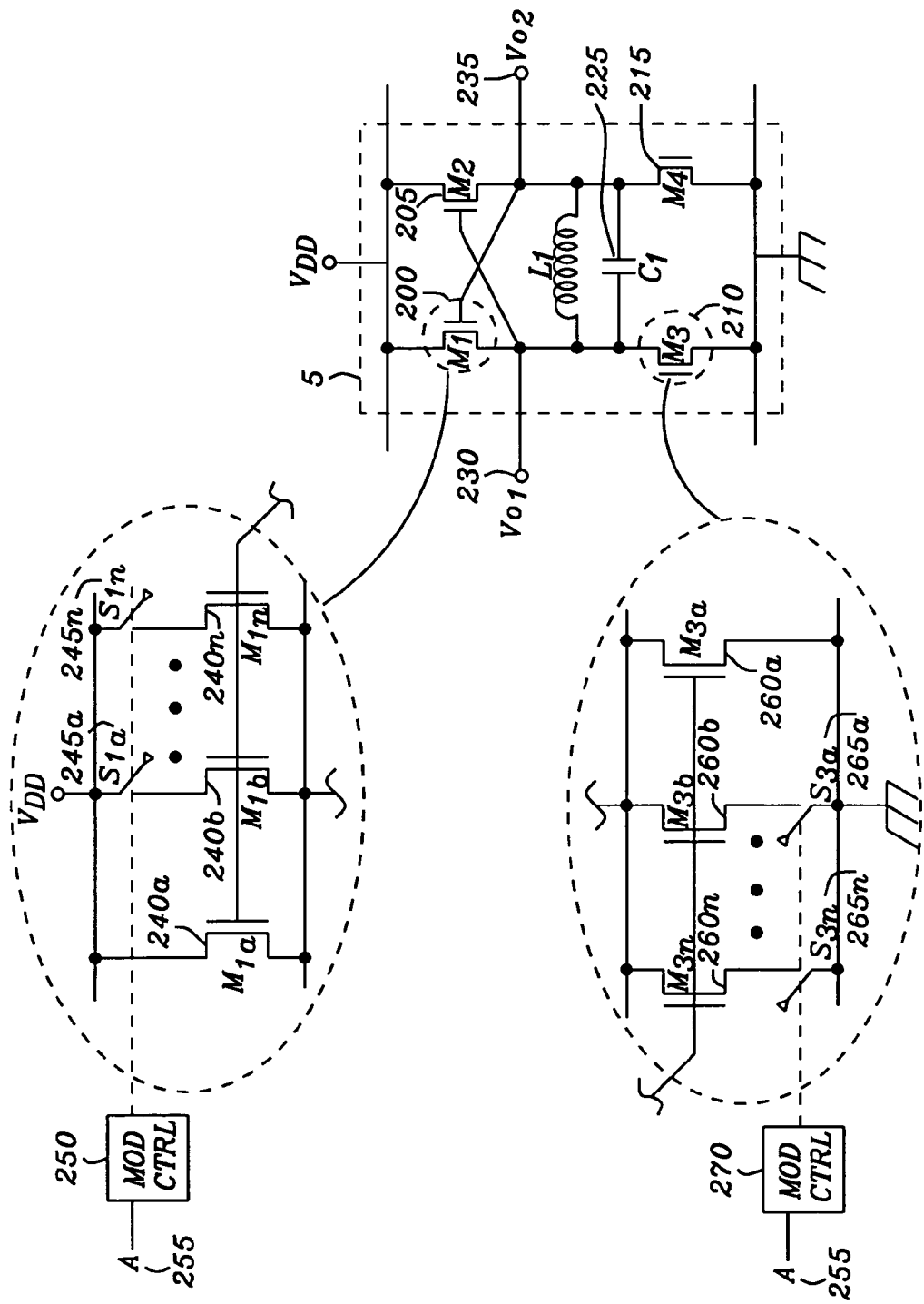
FIG. 4 is a schematic diagram of a second and third embodiment of this invention illustrating the structure of the amplification devices of this invention.

A second and third embodiment of the voltage controlled amplifier of this invention has at least one voltage controlled oscillator that includes amplification devices that adjust the transconductance of the amplification devices and thus the amplitude of the output signals of the voltage controlled amplifier. Refer now to FIG. 4 for a discussion of the second and third embodiments of the amplitude modulation of the output signals of the voltage controlled amplifiers of the power amplifier of this invention.

The voltage controlled oscillator 5 has two amplification devices $M_1$ (200) and $M_2$ (205) that provide the necessary amplification and feedback to provide oscillation. The drain terminals of the two amplification devices $M_1$ (200) and $M_2$ (205) are connected to the power supply voltage source terminal $V_{DD}$. The gate terminals of the two amplification devices $M_1$ (200) and $M_2$ (205) are cross-connected to the opposing source terminals of the two amplification devices $M_1$ (200) and $M_2$ (205). The source terminals of the two amplification devices $M_1$ (200) and $M_2$ (205) are connected to the output terminals 230 and 235 of the voltage controlled oscillator 5.

The inductor $L_1$ (220) and the capacitor $C_1$ (225) from the reactive element that is connected between the source terminals of the two amplification devices $M_1$ (200) and $M_2$ (205) and the output terminals 230 and 235 of the voltage controlled oscillator 5.

The two amplification devices $M_3$ (210) and $M_4$ (215) act as loading devices for the voltage controlled oscillator 5. The source terminals two amplification devices $M_3$ (210) and $M_4$ (215) are connected to a ground reference point and the drain terminals of the two amplification devices $M_3$ (210) and $M_4$ (215) are connected to the source terminals of the two amplification devices $M_1$ (200) and $M_2$ (205) and the output terminals 230 and 235 of the voltage controlled oscillator 5. The gate terminals of the two amplification devices $M_3$ (210) and $M_4$ (215) are connected to the phase/frequency modulation terminal to receive a phase/frequency modulation signal $V_{MOD}$. The level of the phase/frequency modulation signal $V_{MOD}$ adjusts the currents through the two amplification devices $M_3$ (210) and $M_4$ (215) and thus the frequency of the voltage controlled oscillator 5.

The output terminals 230 and 235 of the voltage controlled oscillator 5 are connected to the buffer amplifiers, which provide isolation of the voltage controlled oscillator 5 from the summation combining circuit 15 of FIG. 1.

The first and second amplification devices 200 and 205 comprise multiple transistors 240a, . . . , 240n connected in parallel. The first transistor 240a has its drain connected to the power supply voltage source $V_{DD}$. The drains of the remaining transistors 240b, . . . , 240n are connected to selector switch devices 245a, . . . , 245n. The gates of the multiple transistors 240a, . . . , 240n are connected to the respective gate terminals of the respective first and second amplification devices 200 and 205. The sources of the multiple transistors 240a, . . . , 240n are connected to the respective source terminals of the first and second amplification devices 200 and 205.

The selector switch devices 245a, . . . , 245n have a first terminal connected to the power supply voltage source $V_{DD}$ and a second terminal connected to the drains of the remaining transistors 240b, . . . , 240n. A modulation control circuit 250 has its output connected to a control terminal of each of the selector switch devices 245a, . . . , 245n. The modulation signal A 255 is the input signal to the modulation control circuit 250 and is decoded to select the appropriate switch for the modulation of the transconductance of the first and second amplification devices 200 and 205 and thus the amplitude of the output signals present at the output terminals 230 and 235 of the voltage controlled oscillator 5.

The third and fourth amplification devices 210 and 215 each comprises multiple transistors 260a, . . . , 260n connected in parallel. The first transistor 260a has its source connected to the ground reference point. The sources of the remaining transistors 260b, . . . , 260n are connected to selector switch devices 265a, . . . , 265n. The gates of the multiple transistors 260a, . . . , 260n are connected to the respective gate terminals of the respective third and fourth amplification devices 210 and 215. The drains of the multiple transistors 260a, . . . , 260n are connected to the respective drain terminals of the third and fourth amplification devices 210 and 215.

The selector switch devices 265a, . . . , 265n have a first terminal connected to the ground reference point and a second terminal connected to the sources of the remaining transistors 260b, . . . , 260n. A modulation control circuit 270 has its output connected to a control terminal of each of the selector switch devices 265a, . . . , 265n. The modulation signal A 255 is the input signal to the modulation control circuit 270 and is decoded to select the appropriate selector switch devices 265a, . . . , 265n for the modulation of the transconductance of the third and fourth amplification devices 210 and 215 and thus the amplitude of the output signals present at the output terminals 230 and 235 of the voltage controlled oscillator 5.

Figure 5:
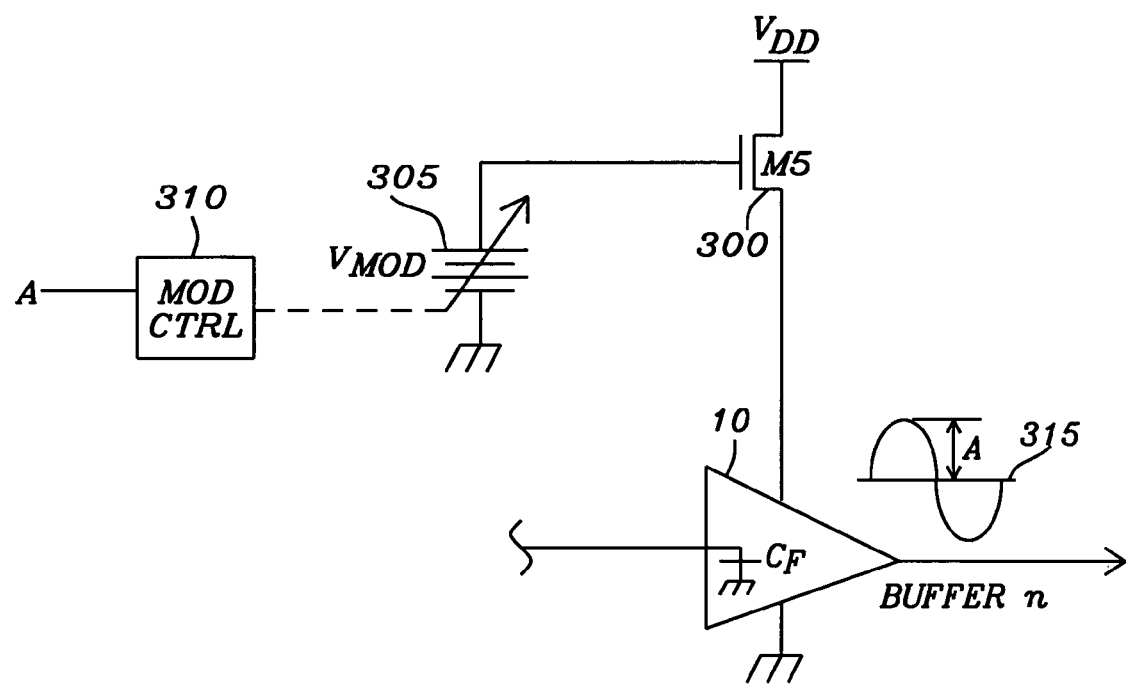
FIG. 5 is a schematic diagram of a fourth embodiment of this invention illustrating amplitude modulation by varying the transconductance of the buffer amplifiers of this invention.

An alternate to modulating the amplitude of the outputs of the voltage controlled oscillators 5a, . . . , 5b of FIG. 1 is to vary the amplitude of the output of the buffers 10a, 10b, 10c, and 10d. Refer now to FIG. 5 for a discussion of a fourth embodiment of the modulation of the high power output signal of the power amplifier of this invention. The buffer 10 is connected between a power supply voltage source $V_{DD}$ and a ground reference point. A transistor 300 is placed between the power supply voltage source $V_{DD}$ and the buffer 10. The drain of the transistor 300 is connected to the power supply voltage source $V_{DD}$ and the source of the transistor 300 is connected to the buffer 10. A variable voltage source $V_{MOD}$ 305 is connected to the gate of the transistor 300. The voltage of the variable voltage course $V_{MOD}$ 305 adjusts the transconductance of the transistor 300 and thus the current to the buffer 10 and thus the amplitude of the output signal 315 of the buffer 10. The modulation control circuit 310 is connected to control the voltage level of the variable voltage source $V_{MOD}$ 305 as dependent upon the input modulation signal A.

Figure 6:
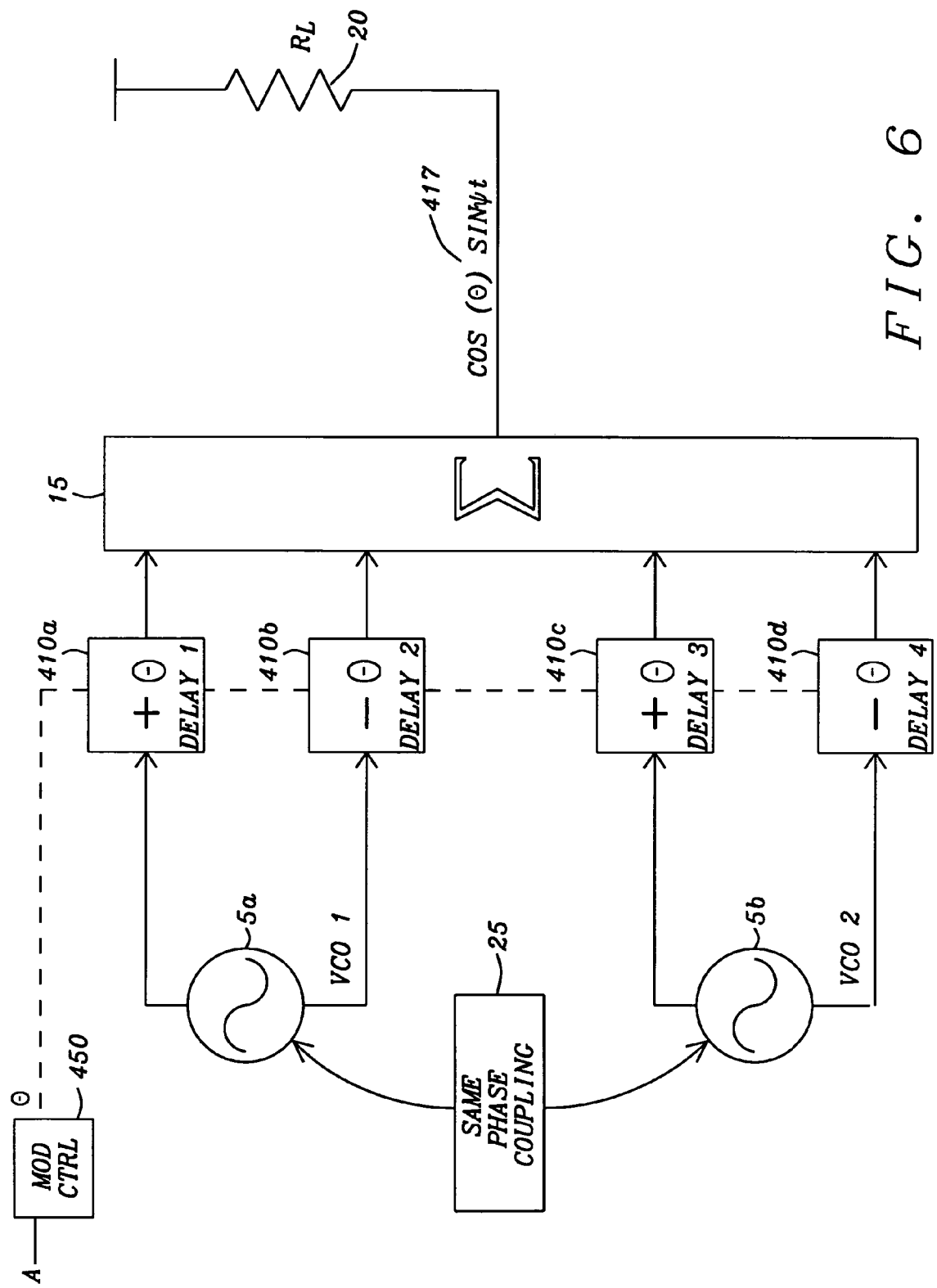
FIG. 6 is a schematic diagram of a fifth embodiment of this invention illustrating amplitude modulation by varying the delay factor of the buffer amplifiers of this invention.

Another alternate to modulating the amplitude of the outputs of the voltage controlled oscillators 5a, . . . , 5b of FIG. 1 is to vary the delay of the output of the buffers 10a, 10b, 10c, and 10d versus the input signals of the buffers 10a, 10b, 10c, and 10d. Refer now to FIG. 6 for a discussion of a fifth embodiment of the modulation of the high power output signal of the power amplifier of this invention. In this case, the buffers 410a, 410b, 410c, and 410d are connected to the voltage controlled oscillators 5a and 5b as described in FIG. 1. The buffers 410a, 410b, 410c, and 410d are designed such that the output θ of the modulation control circuit 450 provides an adjustment to the delay of the buffers 410a, 410b, 410c, and 410d by modifying the transconductance or the feeding currents of the buffers 410a, 410b, 410c, and 410d. The delay adjustment of the buffers 410a, 410b, 410c, and 410d is dependent upon amplitude of the modulating input signal A and thus the high power output signal 417 is determined by the formula:

$$AMS = \cos\theta * \sin\omega t = [\sin(\omega t + \theta) + \sin(\omega t - \theta)]\frac{1}{2}$$

where:
AMS is the amplitude modulated high power output signal 417.
cos θ is the amplitude of the amplitude modulation signal A and θ is the delay factor generated by the output signal of the modulation control circuit.
sin ωt is the amplitude of the output signal of each voltage controlled oscillator 5a and 5b.

Alternately, the high power output signal is determined by the formula:

$$AMS = \sin\theta * \sin\omega t = [\sin(\omega t + \theta) - \sin(\omega t - \theta)] - \frac{1}{2}$$

where:
AMS is the amplitude modulated high power output signal 417.
sin θ is the amplitude of the amplitude modulation signal A and θ is the delay factor generated by the output signal of the modulation control circuit.
sin ωt is the amplitude of the output signal of each voltage controlled oscillators 5a and 5b.

Figure 7:
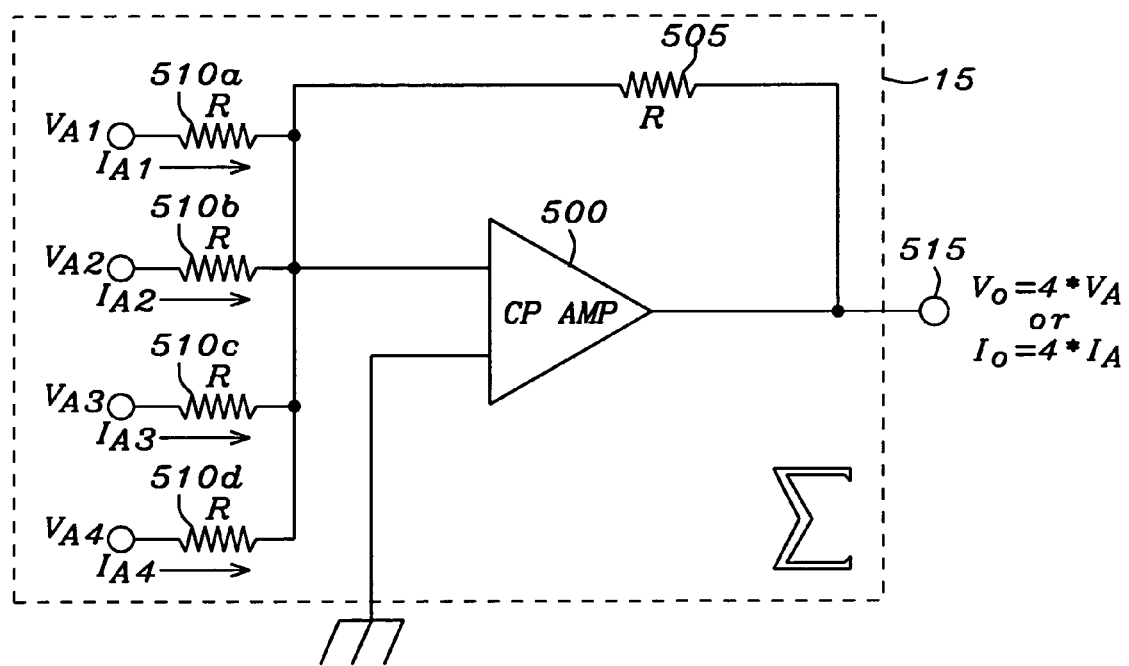
FIG. 7 is a schematic diagram of the signal summing circuit of this invention.

FIG. 7 illustrates an implementation of the summation combining circuit 15 of FIG. 1. The output signals $V_{A1}$, $V_{A2}$, $V_{A3}$, and $V_{A4}$ of the buffers 10a, 10b, 10c, and 10d of FIG. 1 are applied to the resistors 510a, 510b, 510c, and 510d. The resistors 510a, 510b, 510c, and 510d are connected to the operational amplifier 500 with the resistor 505 functioning as a feedback resistor for the circuit. The modulated power high power output signal $V_o$ 515 is determined by the formula:

$$V_o(t) = V_{A1}(t) + V_{A2}(t) + V_{A3}(t) + V_{A4}(t)$$

Alternately, the output signals $I_{A1}$, $I_{A2}$, $I_{A3}$, and $I_{A4}$ are currents from the buffers 10a, 10b, 10c, and 10d of FIG. 1 are passed through the resistors 510a, 510b, 510c, and 510d to create the modulated power high power output signal $I_o$ 515 that is determined by the formula:

$$I_o(t) = I_{A1}(t) + I_{A2}(t) + I_{A3}(t) + I_{A4}(t)$$

While this invention has been particularly shown and described with reference to the preferred embodiments thereof, it will be understood by those skilled in the art that various changes in form and details may be made without departing from the spirit and scope of the invention.

The invention claimed is:

1. A power amplifier to provide a high power output signal comprising:
a plurality of voltage controlled oscillators, each voltage controlled oscillator includes a plurality of input control signal terminals to communicate received phase synchronizing control signals from an adjacent voltage control oscillators of the plurality of voltage control oscillators and a plurality output control signal terminals to communicate transmitted phase control signals to said adjacent voltage control oscillators and a first output signal terminal to transmit a first output signal such that said received phase synchronizing control signals adjusts a phase synchronizing for said first output signal with all of the plurality of said voltage controlled oscillators;
a plurality of first buffer circuits, each first buffer circuit is comprised of an input terminal and an output terminal, said input terminal receiving the first output signal from one voltage controlled oscillator, said buffer circuit amplifying and conditioning said first output signal from one voltage controlled oscillator and transmitting said amplified and conditioned first output signal from said output terminal; and
a signal combining circuit in communication with the buffer circuit receives the amplified and conditioned first output signals, combines said amplified and conditioned first signals to generate said high power output signal.

2. The power amplifier of claim 1 wherein each voltage controlled oscillator further includes a second output terminal to transmit a second output signal, said received phase synchronizing control signals adjusting said phase synchronizing of said second output signal with all others of the plurality of said voltage controlled oscillators.

3. The power amplifier of claim 2 further comprising:
at least one second buffer circuit, each second buffer circuit comprising an input terminal and an output terminal, said input terminal receiving the second output signal from one voltage controlled oscillator, said buffer circuit amplifying and conditioning said second output signal from one voltage controlled oscillator and transmitting said amplified and conditioned second output signal from said output terminal.

4. The power amplifier of claim 3 wherein the signal combining circuit is in communication with the first buffer circuits and the second buffer circuits, receives the amplified and conditioned first and second output signals, combines said amplified and conditioned first and second output signals to generate said high power output signal.

5. The power amplifier of claim 3 further comprises an amplitude modulation circuit connected between the first power supply voltage source and the pluralities of the first and second buffer circuits to adjust an amplifying factor of the pluralities of the first and second buffer circuits to provide an amplitude modulation of said output signal dependent upon the amplitude modulation signal.

6. The power amplifier of claim 3 further comprises an amplitude modulation circuit connected to the pluralities of the first and second buffer circuits to adjust a delay factor of the pluralities of the first and second buffer circuits to provide an amplitude modulation of said output signal dependent upon the amplitude modulation signal.

7. The power amplifier of claim 6 wherein said high power output signal is determined by the formula:

$$AMS = \cos\theta * \sin\omega t = [\sin(\omega t+\theta)+\sin(\omega t-\theta)]\tfrac{1}{2}$$

where:
AMS is the amplitude modulated high power output signal;
$\cos\theta$ is the amplitude of the amplitude modulation signal and $\theta$ is said delay factor; and
$\sin\omega t$ is the amplitude of said output signal of each voltage controlled oscillator.

8. The power amplifier of claim 6 wherein said high power output signal is determined by the formula:

$$AMS = \sin\theta * \sin\omega t = [\sin(\omega t+\theta)-\sin(\omega t-\theta)]\tfrac{1}{2}$$

where:
AMS is the amplitude modulated high power output signal;
$\sin\theta$ is the amplitude of the amplitude modulation signal and $\theta$ is said delay factor; and
$\sin\omega t$ is the amplitude of said output signal of each voltage controlled oscillator.

9. The power amplifier of claim 2 wherein each voltage controlled oscillator comprises:
a first transistor with a source connected to the first output signal terminal, a gate, and a drain connected to a first power supply voltage source;
a second transistor with a source connected to the second output signal terminal and the gate of the first transistor, a gate connected to the source of the first transistor, and a drain connected to the first power supply voltage source;
a frequency determining element connected between the source of the first transistor and the source of the second transistor, said frequency determining element governing a fundamental frequency of each voltage controlled oscillator;
a third transistor with a source connected to a ground reference voltage, a drain connected to first output terminal, a gate connected to the input control signal terminal, and a source connected to a second power supply voltage source; and
a fourth transistor with a source connected to a ground reference voltage, a drain connected to second output terminal, a gate connected to the input control signal terminal, and a source connected to the second power supply voltage source;
wherein the input control signal sets a transconductions of the third and fourth transistors to control a frequency of the first and second output signals to provide a phase/frequency modulation of said first and second output signals.

10. The power amplifier of claim 2 wherein each voltage controlled oscillator comprises:
a first amplification device with a source terminal connected to the first output signal terminal, a gate terminal, a drain terminal connected to a first power supply voltage source, and an amplitude modulation control terminal that receives an amplitude modulation signal that controls a transconductance factor of said first amplification device;
a second amplification device with a source terminal connected to the second output signal terminal and the gate terminal of the first amplification device, a gate terminal connected to the source terminal of the first amplification device, a drain terminal connected to the first power supply voltage source, and an amplitude modulation control terminal that receives the amplitude modulation signal that controls a transconductance factor of said second amplification device; and
a frequency determining element connected between the source terminal of the first amplification and the source of the second amplification device, said frequency determining element governing a fundamental frequency of each voltage controlled oscillator;
wherein the transconductance factor of the first and second amplification devices controls an amplitude of the first and second output signals to provide an amplitude modulation of said first and second output signals.

11. The power amplifier of claim 10 wherein each voltage controlled oscillator further comprises:
a third amplification device with a source terminal connected to a ground reference voltage, a drain terminal connected to first output terminal, a gate connected to the input control signal terminal, and an amplitude modulation control terminal that receives the amplitude modulation signal that controls a transconductance factor of said third amplification device; and
a fourth amplification device with a source terminal connected to the second power supply voltage source, a drain terminal connected to second output terminal, a gate terminal connected to the input control signal terminal, and an amplitude modulation control terminal that receives the amplitude modulation signal that controls a transconductance factor of said first amplification device;
wherein the input control signal sets a conductance of the third and fourth amplification devices to control the frequency of the first and second output signals to provide a phase/frequency modulation of said first and second output signals.

12. The power amplifier of claim 11 wherein the third and fourth amplification devices each comprise:
a second plurality of parallel transistors, whereby each transistor has a gate connected to the gate terminal, a drain connected to the drain terminal, and a drain;
a second plurality of switching devices with a first terminal connected to the source terminal, a second terminal connected the sources of all of the second plurality of parallel transistors excepting a first transistor of the second plurality of parallel transistors, and a control terminal to control the modulation;
wherein the source of the first transistor of the second plurality of parallel transistors is connected to the source terminal; and
a second modulation control device connected to the amplitude modulation control terminal, receives the amplitude modulation signal, interprets said amplitude modulation signal to selectively activate any of the second plurality of switching devices to connect the drains of the selected parallel transistors to the drain terminal and modifies said transconductance factor.

13. The power amplifier of claim 10 wherein the first and second amplification devices each comprise:
a first plurality of parallel transistors, whereby each transistor has a gate connected to the gate terminal, a source connected to the source terminal, and a drain;

a first plurality of switching devices with a first terminal connected to the drain terminal, a second terminal connecting the drains of all of the first plurality of parallel transistors excepting a first transistor of the first plurality of parallel transistors, and a control terminal to control the modulation;

wherein the drain of the first transistor of the first plurality of parallel transistors is connected to the drain terminal; and a first modulation control device connected to the amplitude modulation control terminal, receives the amplitude modulation signal, interprets said amplitude modulation signal and selectively activates any of the plurality of switching devices to connect the drains of the selected parallel transistors to the drain terminal and modifies said transconductance factor.

14. The power amplifier of claim 2 further comprising a phase synchronization circuit in communication with each of the voltage controlled oscillators to generate said received and transmitted phase synchronizing control signals for phase synchronizing said plurality of voltage controlled oscillators.

15. The power amplifier of claim 14 wherein said phase synchronization circuit comprises:

a first plurality of buffer circuits serially connected such that an output of each buffer circuit of said first plurality of buffer circuits is connected to an input of a succeeding buffer circuit and a first buffer circuit of said first plurality of serially connected buffer circuits has an input connected to said first output signal terminal of a first voltage controlled oscillator and the output of each buffer circuit of said first plurality of buffer circuits is connected to a first input control terminal of each adjacent voltage controlled oscillator of said plurality of voltage controlled oscillators;

a second plurality of buffer circuits serially connected such that an output of each buffer circuit of said second plurality of buffer circuits is connected to an input of a succeeding buffer circuit and a first buffer circuit of said second plurality of serially connected buffer circuits has an input connected to said first output signal terminal of said first voltage controlled oscillator and the output of each buffer circuit of said second plurality of buffer circuits is connected to a first input control terminal of each adjacent voltage controlled oscillator of said plurality of voltage controlled oscillators;

a third plurality of buffer circuits serially connected such that an output of each buffer circuit of said third plurality of buffer circuits is connected to an input of a succeeding buffer circuit and a first buffer circuit of said third plurality of buffer circuits has an output connected to said first input control signal terminal of said first voltage controlled oscillator and the input of each buffer circuit of said third plurality of buffer circuits is connected to said first output signal terminal of each adjacent voltage controlled oscillator of said plurality of voltage controlled oscillators; and a fourth plurality of buffer circuits serially connected such that an output of each buffer circuit of said fourth plurality of buffer circuits is connected to an input of a succeeding buffer circuit and a first buffer circuit of said fourth plurality of buffer circuits has an output connected to said second input control signal terminal of said first voltage controlled oscillator and the input of each buffer circuit of said first plurality of buffer circuits is connected to said second output signal terminal of each adjacent voltage controlled oscillator of said plurality of voltage controlled oscillators.

16. A power amplifier to provide a high power output signal comprising:

plurality of voltage controlled oscillators, each voltage controlled oscillator comprising:

an input control signal terminal to receive an input control signal, a first output signal terminal to transmit a first output signal such that said input control signal adjusts a frequency for said first output signal, and a phase control port to receive and transmit a phase control signal;

a phase control circuit in communication with the phase control port of each of the plurality of voltage controlled oscillators to propagate the phase control signals to and from each voltage controlled oscillators such that each of the plurality of voltage controlled oscillators has an identical phasing of said first output signal;

a plurality of first buffer circuits, each first buffer circuit comprised of an input terminal and an output terminal, said input terminal receiving the first output signal from one voltage controlled oscillator, said buffer circuit amplifying and conditioning said first output signal from one voltage controlled oscillator and transmitting said amplified and conditioned first output signal from said output terminal; and a signal combining circuit in communication with the buffer circuit receives the amplified and conditioned first output signals, combines said amplified and conditioned first signals to generate said high power output signal.

17. The power amplifier of claim 16 wherein the voltage controlled oscillator further includes a second output terminal to transmit a second output signal, said input control signal adjusting the frequency of said second output signal and said phase control circuit propagating the phase control signals such that each of the voltage controlled oscillators has an identical phasing of said first and second output signals.

18. The power amplifier of claim 17 further comprising:

a plurality of second buffer circuits, each second buffer circuit comprised of an input terminal and an output terminal, said input terminal receiving the second output signal from one voltage controlled oscillator, said buffer circuit amplifying and conditioning said second output signal from one voltage controlled oscillator and transmitting said amplified and conditioned second output signal from said output terminal.

19. The power amplifier of claim 18 wherein the signal combining circuit is in communication with the first buffer circuits and the second buffer circuits, receives the amplified and conditioned first and second output signals, combines said amplified and conditioned first and second output signals to generate said high power output signal.

20. The power amplifier of claim 18 further comprises an amplitude modulation circuit connected between the first power supply voltage source and the pluralities of the first and second buffer circuits to adjust an amplifying factor of the pluralities of the first and second buffer circuits to provide an amplitude modulation of said output signal dependent upon the amplitude modulation signal.

21. The power amplifier of claim 20 wherein said high power output signal is determined by the formula:

$$AMS = \cos\theta * \sin\omega t = [\sin(\omega t + \theta) + \sin(\omega t - \theta)]^{1/2}$$

where:
   AMS is the amplitude modulated high power output signal;
   cos θ is the amplitude of the amplitude modulation signal and θ is said delay factor; and
   sin ωt is the amplitude of said output signal of each voltage controlled oscillator.

22. The power amplifier of claim 20 wherein said high power output signal is determined by the formula:

$$AMS=\sin\theta*\sin\omega t=[\sin(\omega t+\theta)-\sin(\omega t-\theta)]-\tfrac{1}{2}$$

where:
   AMS is the amplitude modulated high power output signal;
   sin θ is the amplitude of the amplitude modulation signal and θ is said delay factor; and
   sin ωt is the amplitude of said output signal of each voltage controlled oscillator.

23. The power amplifier of claim 18 further comprises an amplitude modulation circuit connected to the pluralities of the first and second buffer circuits to adjust a delay factor of the pluralities of the first and second buffer circuits to provide an amplitude modulation of said output signal dependent upon the amplitude modulation signal.

24. The power amplifier of claim 17 wherein each voltage controlled oscillator comprises:
   a first transistor with a source connected to the first output signal terminal, a gate, and a drain connected to a first power supply voltage source;
   a second transistor with a source connected to the second output signal terminal and the gate of the first transistor, a gate connected to the source of the first transistor, and a drain connected to the first power supply voltage source;
   a frequency determining element connected between the source of the first transistor and the source of the second transistor, said frequency determining element governing a fundamental frequency of each voltage controlled oscillator;
   a third transistor with a source connected to a ground reference voltage, a drain connected to first output terminal, a gate, and a source connected to a second power supply voltage source; and
   a fourth transistor with a source connected to a ground reference voltage, a drain connected to second output terminal, a gate, and a source connected to the second power supply voltage source;
   wherein the input control signal sets a conductance of the third and fourth transistors to control the frequency of the first and second output signals to provide a phase/frequency modulation of said first and second output signals.

25. The power amplifier of claim 24 wherein the gates of the third and fourth transistors are connected to the input control signal terminal.

26. The power amplifier of claim 24 wherein the phase control circuit comprises:
   a first plurality of buffer circuits serially connected such that an output of each buffer circuit of said first plurality of buffer circuits is connected to an input of a succeeding buffer circuit and a first buffer circuit of said first plurality of serially connected buffer circuits has an input connected to said first output signal terminal of a first voltage controlled oscillator and the output of each buffer circuit of said first plurality of buffer circuits is connected to a first input control terminal of each adjacent voltage controlled oscillator of said plurality of voltage controlled oscillators;
   a second plurality of buffer circuits serially connected such that an output of each buffer circuit of said second plurality of buffer circuits is connected to an input of a succeeding buffer circuit and a first buffer circuit of said second plurality of serially connected buffer circuits has an input connected to said first output signal terminal of said first voltage controlled oscillator and the output of each buffer circuit of said second plurality of buffer circuits is connected to a first input control terminal of each adjacent voltage controlled oscillator of said plurality of voltage controlled oscillators;
   a third plurality of buffer circuits serially connected such that an output of each buffer circuit of said third plurality of buffer circuits is connected to an input of a succeeding buffer circuit and a first buffer circuit of said third plurality of buffer circuits has an output connected to said first input control signal terminal of said first voltage controlled oscillator and the input of each buffer circuit of said third plurality of buffer circuits is connected to said first output signal terminal of each adjacent voltage controlled oscillator of said plurality of voltage controlled oscillators; and
   a fourth plurality of buffer circuits serially connected such that an output of each buffer circuit of said fourth plurality of buffer circuits is connected to an input of a succeeding buffer circuit and a first buffer circuit of said fourth plurality of buffer circuits has an output connected to said second input control signal terminal of said first voltage controlled oscillator and the input of each buffer circuit of said first plurality of buffer circuits is connected to said second output signal terminal of each adjacent voltage controlled oscillator of said plurality of voltage controlled oscillators.

27. The power amplifier of claim 26 wherein the input control signal terminal of said first voltage controlled oscillator of said plurality of voltage controlled oscillators is connected to the gates of the third and fourth transistors of said first voltage controlled oscillator to provide control signals to control the phase/frequency of said first voltage controlled oscillator and thus the phase of the plurality of voltage controlled oscillators.

28. The power amplifier of claim 17 wherein each voltage controlled oscillator comprises:
   a first amplification device with a source terminal connected to the first output signal terminal, a gate terminal, a drain terminal connected to a first power supply voltage source, and an amplitude modulation control terminal that receives an amplitude modulation signal that controls a transconductance factor of said first amplification device;
   a second amplification device with a source terminal connected to the second output signal terminal and the gate terminal of the first amplification device, a gate terminal connected to the source terminal of the first amplification device, a drain terminal connected to the first power supply voltage source, and an amplitude modulation control terminal that receives the amplitude modulation signal that controls a transconductance factor of said second amplification device; and
   a frequency determining element connected between the source terminal of the first amplification and the source of the second amplification device, said frequency determining element governing a fundamental frequency of each voltage controlled oscillator;

wherein the transconductance factor of the first and second amplification devices controls an amplitude of the first and second output signals to provide an amplitude modulation of said first and second output signals.

29. The power amplifier of claim 28 wherein each voltage controlled oscillator further comprises:
a third amplification device with a source terminal connected to a ground reference voltage, a drain terminal connected to first output terminal, a gate connected to the input control signal terminal, and an amplitude modulation control terminal that receives the amplitude modulation signal that controls a transconductance factor of said third amplification device; and
a fourth amplification device with a source terminal connected to the second power supply voltage source, a drain terminal connected to second output terminal, a gate terminal connected to the input control signal terminal, and an amplitude modulation control terminal that receives the amplitude modulation signal that controls a transconductance factor of said first amplification device;
wherein the input control signal sets a conductance of the third and fourth amplification devices to control the frequency of the first and second output signals to provide a phase/frequency modulation of said first and second output signals.

30. The power amplifier of claim 29 wherein the third and fourth amplification devices each comprise:
a second plurality of parallel transistors, whereby each transistor has a gate connected to the gate terminal, a drain connected to the drain terminal, and a drain;
a second plurality of switching devices with a first terminal connected to the source terminal, a second terminal connected to the sources of all of the second plurality of parallel transistors excepting a first transistor of the second plurality of parallel transistors, and a control terminal to control the modulation;
wherein the source of the first transistor of the second plurality of parallel transistors is connected to the source terminal; and
a second modulation control device is connected to the amplitude modulation control terminal to receive the amplitude modulation signal, interpret said amplitude modulation signal to selectively activate any of the second plurality of switching devices to connect the drains of the selected parallel transistors to the drain terminal and modify said transconductance factor.

31. The power amplifier of claim 28 wherein the first and second amplification devices each comprise:
a first plurality of parallel transistors, whereby each transistor has a gate connected to the gate terminal, a source connected to the source terminal, and a drain;
a first plurality of switching devices with a first terminal connected to the drain terminal, a second terminal connecting the drains of all of the first plurality of parallel transistors excepting a first transistor of the first plurality of parallel transistors, and a control terminal to control the modulation;
wherein the drain of the first transistor of the first plurality of parallel transistors is connected to the drain terminal; and
a first modulation control device connected to amplitude modulation control terminal to receive the amplitude modulation signal, interpret said amplitude modulation signal to selectively activate any of the plurality of switching devices to connect the drains of the selected parallel transistors to the drain terminal and modify said transconductance factor.

32. A method for power amplification and modulation of a fundamental signal to provide a high power output signal comprising the steps of:
generating a plurality of first fundamental signals;
generating a plurality of phase synchronizing control signals from said first fundamental signals to phase synchronize said first fundamental signals;
buffering said modulated first fundamental signals, said buffering comprising the steps of:
amplifying and conditioning said phase synchronizing first fundamental signals; and
combining said amplified and conditioned first fundamental signals to generate said high power output signal.

33. The method for power amplification and modulation of claim 32 further comprises the steps of:
generating a second fundamental signal;
phase synchronizing said second fundamental signal.

34. The method for power amplification and modulation of claim 33 further comprising the steps of:
buffering said modulated second fundamental signal, said buffering comprising the steps of
amplifying and conditioning said modulated second fundamental signal.

35. The method for power amplification and modulation of claim 34 further comprising the step of combining said amplified and conditioned first and second fundamental signals to generate said high power output signal.

36. The method for power amplification and modulation of claim 34 further comprising the steps of:
receiving an amplitude modulation signal; and
modulating an amplitude of each of the first and second fundamental signals correlated to the amplitude modulation signal.

37. The method for power amplification and modulation of claim 36 wherein buffering the first and second fundamental signals is provided by at least one buffer circuit, each buffer circuit is comprised of an input terminal and an output terminal, said input terminal receiving the first or second fundamental signal, said buffer circuit amplifying and conditioning said first or second fundamental signal, and transmitting said amplified and conditioned first or second output signal from said output terminal.

38. The method for power amplification and modulation of claim 37 wherein modulating the amplitude of each of said first and second fundamental signals is performed by an amplitude modulation circuit connected between the first power supply voltage source and the buffer circuits to adjust an amplifying factor of the pluralities of the buffer circuits to provide an amplitude modulation of said output signal dependent upon the amplitude modulation signal.

39. The method for power amplification and modulation of claim 37 wherein modulating the amplitude of each of said first and second fundamental signals is performed an amplitude modulation circuit connected to the buffer circuits to adjust a delay factor of the buffer circuits to provide an amplitude modulation of said output signal dependent upon the amplitude modulation signal.

40. The method for power amplification and modulation of claim 39 wherein said high power output signal is determined by the formula:

$$AMS = \cos\theta * \sin\omega t = [\sin(\omega t+\theta)+\sin(\omega t-\theta)]\frac{1}{2}$$

where:
AMS is the amplitude modulated high power output signal;

cos θ is the amplitude of the amplitude modulation signal and θ is said delay factor; and sin ωt is the amplitude of said output signal of each voltage controlled oscillator.

41. The method for power amplification and modulation of claim 39 wherein said high power output signal is determined by the formula:

$$AMS = \sin\theta * \sin\omega t = [\sin(\omega t+\theta) - \sin(\omega t-\theta)] - \frac{1}{2}$$

where:
AMS is the amplitude modulated high power output signal;
sin θ is the amplitude of the amplitude modulation signal and θ is said delay factor; and
sin ωt is the amplitude of said output signal of each voltage controlled oscillator.

42. The method for power amplification and modulation of claim 33 wherein generating each of the first and second fundamental signals is performed by a voltage controlled oscillator, the voltage controlled oscillator comprising:
a first transistor with a source connected to the first fundamental signal terminal, a gate, and a drain connected to a first power supply voltage source;
a second transistor with a source connected to the second fundamental signal terminal and the gate of the first transistor, a gate connected to the source of the first transistor, and a drain connected to the first power supply voltage source;
a frequency determining element connected between the source of the first transistor and the source of the second transistor, said frequency determining element governing a fundamental frequency of each voltage controlled oscillator;
a third transistor with a source connected to a ground reference voltage, a drain connected to first output terminal, a gate connected to the input control signal terminal, and a source connected to a second power supply voltage source; and
a fourth transistor with a source connected to a ground reference voltage, a drain connected to second output terminal, a gate connected to the input control signal terminal, and a source connected to the second power supply voltage source;
wherein the input control signal sets a conductance of the third and fourth transistors to control the frequency of the first and second fundamental signals to provide a phase/frequency modulation of said first and second fundamental signals.

43. The method for power amplification and modulation of claim 33 further comprising the steps of:
receiving an amplitude modulation signal; and
modulating an amplitude of each of the first and second fundamental signals correlated to the amplitude modulation signal.

44. The method for power amplification and modulation of claim 43 wherein generating each of the first and second fundamental signals is performed by a voltage controlled oscillator, the voltage controlled oscillator comprising:
a first amplification device with a source terminal connected to the first output signal terminal, a gate terminal, a drain terminal connected to a first power supply voltage source, and an amplitude modulation control terminal that receives the amplitude modulation signal that controls a transconductance factor of said first amplification device;
a second amplification device with a source terminal connected to the second output signal terminal and the gate terminal of the first amplification device, gate terminal connected to the source terminal of the first amplification device, a drain terminal connected to the first power supply voltage source, and an amplitude modulation control terminal that receives the amplitude modulation signal that controls a transconductance factor of said second amplification device; and
a frequency determining element connected between the source terminal of the first amplification and the source of the second amplification device, said frequency determining element governing a fundamental frequency of each voltage controlled oscillator;
wherein the transconductance factor of the first and second amplification device controls an amplitude of each of the first and second fundamental signals to provide an amplitude modulation of said first and second fundamental signals.

45. The method for power amplification and modulation of claim 44 wherein each voltage controlled oscillator further comprises:
a third amplification device with a source terminal connected to a ground reference voltage, a drain terminal connected to a first output terminal, a gate connected to the input control signal terminal, and an amplitude modulation control terminal that receives the amplitude modulation signal that controls a transconductance factor of said third amplification device; and
a fourth amplification device with a source terminal connected to the second power supply voltage source, a drain terminal connected to second output terminal, a gate terminal connected to the input control signal terminal, and an amplitude modulation control terminal that receives the amplitude modulation signal that controls a transconductance factor of said first amplification device;
wherein the input control signal sets a conductance of the third and fourth amplification devices to control the frequency of the first and second output signals to provide a phase/frequency modulation of said first and second output signals.

46. The method for power amplification and modulation of claim 45 wherein the third and fourth amplification devices each comprise:
a second plurality of parallel transistors, whereby each transistor has a gate connected to the gate terminal, a drain connected to the drain terminal, and a drain;
a second plurality of switching devices with a first terminal connected to the source terminal, a second terminal connected the sources of all of the second plurality of parallel transistors excepting a first transistor of the second plurality of parallel transistors, and a control terminal to control the amplitude modulation of the first and second fundamental signals;
wherein the source of the first transistor of the second plurality of parallel transistors is connected to the source terminal; and
a second modulation control device is connected to amplitude modulation control terminal to receive the amplitude modulation signal, interpret said amplitude modulation signal to selectively activate any of the second plurality of switching devices to connect the drains of the selected parallel transistors to the drain terminal and modify said transconductance factor.

47. The method for power amplification and modulation of claim 44 wherein the first and second amplification devices each comprise:

a first plurality of parallel transistors, whereby each transistor has a gate connected to the gate terminal, a source connected to the source terminal, and a drain;

a first plurality of switching devices with a first terminal connected to the drain terminal, a second terminal connecting the drains of all of the first plurality of parallel transistors excepting a first transistor of the first plurality of parallel transistors, and a control terminal to control the amplitude modulation of the first and second fundamental signals;

wherein the drain of the first transistor of the first plurality of parallel transistors is connected to the drain terminal; and a first modulation control device connected to amplitude modulation control terminal, receives the amplitude modulation signal, interprets said amplitude modulation signal to selectively activate any of the plurality of switching devices to connect the drains of the selected parallel transistors to the drain terminal and modifies said transconductance factor.

48. A method for power amplification and modulation of a fundamental signal to provide a high power output signal comprising the steps of:

generating a plurality of first fundamental signals;

providing an input control signal to phase/frequency modulate said first fundamental signals;

generating a plurality of phase synchronizing control signals from said first fundamental signals to phase synchronize said first fundamental signals;

buffering said modulated and synchronized first fundamental signals, said buffering comprising the steps of amplifying and conditioning said modulated first fundamental signals; and combining said amplified and conditioned first fundamental signals to generate said high power output signal.

49. The method for power amplification and modulation of claim 48 further comprises the steps of:

generating a plurality second fundamental signal;

phase/frequency modulating said second fundamental signal; and synchronizing a phase of each first and second fundamental signal such that each first and second fundamental signal has an identical phasing.

50. The method for power amplification and modulation of claim 49 further comprising the steps of:

buffering said modulated second fundamental signal, said buffering comprising the steps of
amplifying and conditioning said modulated second fundamental signal.

51. The method for power amplification and modulation of claim 50 further comprising the step of combining said amplified and conditioned first and second fundamental signal to generate said high power output signal.

52. The method for power amplification and modulation of claim 50 further comprising the steps of:

receiving an amplitude modulation signal; and modulating an amplitude of each of the first and second fundamental signals correlated to the amplitude modulation signal.

53. The method for power amplification and modulation of claim 49 wherein generating each of the first and second fundamental signals is performed by a voltage controlled oscillator, the voltage controlled oscillator comprising:

a first transistor with a source connected to the first fundamental signal terminal, a gate, and a drain connected to a first power supply voltage source;

a second transistor with a source connected to the second fundamental signal terminal and the gate of the first transistor, a gate connected to the source of the first transistor, and a drain connected to the first power supply voltage source;

a frequency determining element connected between the source of the first transistor and the source of the second transistor, said frequency determining element governing a fundamental frequency of each voltage controlled oscillator;

a third transistor with a source connected to a ground reference voltage, a drain connected to first output terminal, a gate, and a source connected to a second power supply voltage source; and a fourth transistor with a source connected to a ground reference voltage, a drain connected to second output terminal, a gate, and a source connected to the second power supply voltage source;

wherein the input control signal sets a conductance of the third and fourth transistors to control the frequency of the first and second fundamental signals to provide a phase/frequency modulation of said first and second fundamental signals.

54. The method for power amplification and modulation of claim 53 wherein synchronizing the phase of the first and second fundamental signals is performed by a phase control circuit, said phase control circuit comprising a plurality of buffer amplifiers, each buffer amplifier including an input terminal and an output terminal such that a signal presented to said input terminal is transferred to said output terminal; wherein a pair of the plurality of voltage controlled oscillators has four of the plurality of buffer amplifiers installed between them, such that:

the input terminal of a first buffer amplifier of said four buffer amplifiers is connected to the first output terminal of a first of said pair of voltage controlled oscillators and the output of said first buffer amplifier is connected to the gate of the third transistor of a second voltage controlled oscillator of the pair of voltage controlled oscillators;

the input terminal of a second buffer amplifier of said four buffer amplifiers is connected to the first output terminal of the second of said pair of voltage controlled oscillators and the output of said second buffer amplifier is connected to the gate of the third transistor of a first voltage controlled oscillator of the pair of voltage controlled oscillators;

the input terminal of a third buffer amplifier of said four buffer amplifiers is connected to the second output terminal of the first of said pair of voltage controlled oscillators and the output of said third buffer amplifier is connected to the gate of the fourth transistor of the second voltage controlled oscillator of the pair of voltage controlled oscillators; and the input terminal of a fourth buffer amplifier of said four buffer amplifiers is connected to the second output terminal of the second voltage controlled oscillator of said pair of voltage controlled oscillators and the output of said second buffer amplifier is connected to the gate of the fourth transistor of a first voltage controlled oscillator of the pair of voltage controlled oscillators.

55. The method for power amplification and modulation of claim 54 wherein an input control signal terminal of a master voltage controlled oscillator of said plurality of voltage controlled oscillators is connected to the gates of the third and fourth transistors of said master voltage controlled oscillator to provide a control signal to control the phase/ frequency of said master voltage controlled oscillator and thus the phase of the plurality of voltage controlled oscillators.

56. The method for power amplification and modulation of claim 55 wherein each voltage controlled oscillator further comprises:
a third amplification device with a source terminal connected to a ground reference voltage, a drain terminal connected to first output terminal, a gate connected to the input control signal terminal, and an amplitude modulation control terminal that receives the amplitude modulation signal that controls a transconductance factor of said third amplification device; and
a fourth amplification device with a source terminal connected to the second power supply voltage source, a drain terminal connected to second output terminal, a gate terminal connected to the input control signal terminal, and an amplitude modulation control terminal that receives the amplitude modulation signal that controls a transconductance factor of said first amplification device;
wherein the input control signal sets a conductance of the third and fourth amplification devices to control the frequency of the first and second output signals to provide a phase/frequency modulation of said first and second output signals.

57. The method for power amplification and modulation of claim 55 wherein the first and second amplification devices each comprise:
a first plurality of parallel transistors, whereby each transistor has a gate connected to the gate terminal, a source connected to the source terminal, and a drain;
a first plurality of switching devices with a first terminal connected to the drain terminal, a second terminal connecting the drains of all of the first plurality of parallel transistors excepting a first transistor of the first plurality of parallel transistors, and a control terminal to control the amplitude modulation of the first and second fundamental signals;
wherein the drain of the first transistor of the first plurality of parallel transistors is connected to the drain terminal; and
a first modulation control device connected to an amplitude modulation control terminal to receive the amplitude modulation signal, interpret said amplitude modulation signal to selectively activate any of the plurality of switching devices to connect the drains of the selected parallel transistors to the drain terminal and modify said transconductance factor.

58. The method for power amplification and modulation of claim 57 wherein buffering the first and second fundamental signals is provided by at least one buffer circuit, each buffer circuit is comprised of an input terminal and an output terminal, said input terminal receiving the first or second fundamental signal, said buffer circuit amplifying and conditioning said first or second fundamental signal, and transmitting said amplified and conditioned first or second output signal from said output terminal.

59. The method for power amplification and modulation of claim 54 wherein generating each of the first and second fundamental signals is performed by a voltage controlled oscillator, the voltage controlled oscillator comprising:
a first amplification device with a source terminal connected to the first output signal terminal, a gate terminal, a drain terminal connected to a first power supply voltage source, and an amplitude modulation control terminal that receives the amplitude modulation signal that controls a transconductance factor of said first amplification device;
a second amplification device with a source terminal connected to the second output signal terminal and the gate terminal of the first amplification device, a gate terminal connected to the source terminal of the first amplification device, a drain terminal connected to the first power supply voltage source, and an amplitude modulation control terminal that receives the amplitude modulation signal that controls a transconductance factor of said second amplification device; and
a frequency determining element connected between the source terminal of the first amplification and the source of the second amplification device, said frequency determining element governing a fundamental frequency of each voltage controlled oscillator;
wherein the transconductance factor of the first and second amplification devices controls an amplitude of each of the first and second fundamental signals to provide an amplitude modulation of said first and second fundamental signals.

60. The method for power amplification and modulation of claim 49 further comprising the steps of:
receiving an amplitude modulation signal; and
modulating an amplitude of each of the first and second fundamental signals correlated to the amplitude modulation signal.

61. The method for power amplification and modulation of claim 60 wherein the third and fourth amplification devices each comprise:
a second plurality of parallel transistors, whereby each transistor has a gate connected to the gate terminal, a drain connected to the drain terminal, and a drain;
a second plurality of switching devices with a first terminal connected to the source terminal, a second terminal connected the sources of all of the second plurality of parallel transistors excepting a first transistor of the second plurality of parallel transistors, and a control terminal to control the amplitude modulation of the first and second fundamental signals;
wherein the source of the first transistor of the second plurality of parallel transistors is connected to the source terminal; and
a second modulation control device connected to an amplitude modulation control terminal to receive the amplitude modulation signal, interpret said amplitude modulation signal to selectively activate any of the second plurality of switching devices to connect the drains of the selected parallel transistors to the drain terminal and modify said transconductance factor.

62. The method for power amplification and modulation of claim 61 wherein modulating the amplitude of each of said first and second fundamental signals is performed by an amplitude modulation circuit connected between the first power supply voltage source and the buffer circuits to adjust an amplifying factor of the pluralities of the buffer circuits to provide an amplitude modulation of said output signal dependent upon the amplitude modulation signal.

63. The method for power amplification and modulation of claim 62 wherein said high power output signal is determined by the formula:

$$AMS = \cos\theta * \sin\omega t = [\sin(\omega t + \theta) + \sin(\omega t - \theta)]^{1/2}$$

where:
AMS is the amplitude modulated high power output signal;

cos θ is the amplitude of the amplitude modulation signal and θ is said delay factor; and sin ωt is the amplitude of said output signal of each voltage controlled oscillator.

64. The method for power amplification and modulation of claim 62 wherein said high power output signal is determined by the formula:

$$AMS = \sin\theta * \sin\omega t = [\sin(\omega t+\theta) - \sin(\omega t-\theta)] \cdot \tfrac{1}{2}$$

where:
AMS is the amplitude modulated high power output signal;
sin θ is the amplitude of the amplitude modulation signal and θ is said delay factor; and
sin ωt is the amplitude of said output signal of each voltage controlled oscillator.

65. The method for power amplification and modulation of claim 61 wherein modulating the amplitude of each of said first and second fundamental signals is performed an amplitude modulation circuit connected to the buffer circuits to adjust a delay factor of the buffer circuits to provide an amplitude modulation of said output signal dependent upon the amplitude modulation signal.

66. An apparatus for power amplification and modulation of a fundamental signal to provide a high power output signal comprising:
means for generating a plurality of first fundamental signals;
means for generating a plurality of phase synchronizing control signal from said first fundamental signals to phase synchronize said first fundamental signals;
means for buffering said modulated first fundamental signals, said buffering comprising:
means for amplifying and conditioning said phase synchronized first fundamental signals; and
means for combining said amplified and conditioned first fundamental signals to generate said high power output signal.

67. The apparatus for power amplification and modulation of claim 66 further comprises:
means for generating a second fundamental signal;
means for phase/frequency modulating said second fundamental signal.

68. The apparatus for power amplification and modulation of claim 67 further comprising:
means for buffering said modulated second fundamental signal, said buffering comprising the steps of
means for amplifying and conditioning said modulated second fundamental signal.

69. The apparatus for power amplification and modulation of claim 68 further comprising means for combining said amplified and conditioned first and second fundamental signals to generate said high power output signal.

70. The apparatus for power amplification and modulation of claim 68 further comprising:
means for receiving an amplitude modulation signal; and
means for modulating an amplitude of each of the first and second fundamental signals correlated to the amplitude modulation signal.

71. The apparatus for power amplification and modulation of claim 70 wherein means for buffering the first and second fundamental signals comprises at least one buffer circuit, each buffer circuit comprising an input terminal and an output terminal, said input terminal receiving the first or second fundamental signal, said buffer circuit amplifying and conditioning said first or second fundamental signal, and transmitting said amplified and conditioned first or second output signal from said output terminal.

72. The apparatus for power amplification and modulation of claim 70 wherein means for modulating the amplitude of each of said first and second fundamental signals comprises an amplitude modulation circuit connected between the first power supply voltage source and the buffer circuits to adjust an amplifying factor of the pluralities of the buffer circuits to provide an amplitude modulation of said output signal dependent upon the amplitude modulation signal.

73. The apparatus for power amplification and modulation of claim 72 wherein said high power output signal is determined by the formula:

$$AMS = \cos\theta * \sin\omega t = [\sin(\omega t+\theta) + \sin(\omega t-\theta)] \tfrac{1}{2}$$

where:
AMS is the amplitude modulated high power output signal;
cos θ is the amplitude of the amplitude modulation signal and θ is said delay factor; and
sin ωt is the amplitude of said output signal of each voltage controlled oscillator.

74. The apparatus for power amplification and modulation of claim 72 wherein said high power output signal is determined by the formula:

$$AMS = \sin\theta * \sin\omega t = [\sin(\omega t+\theta) - \sin(\omega t-\theta)] \cdot \tfrac{1}{2}$$

where:
AMS is the amplitude modulated high power output signal;
sin θ is the amplitude of the amplitude modulation signal and θ is said delay factor; and
sin ωt is the amplitude of said output signal of each voltage controlled oscillator.

75. The apparatus for power amplification and modulation of claim 70 wherein means for modulating the amplitude of each of said first and second fundamental signals comprises an amplitude modulation circuit connected to the buffer circuits to adjust a delay factor of the buffer circuits to provide an amplitude modulation of said output signal dependent upon the amplitude modulation signal.

76. The apparatus for power amplification and modulation of claim 67 wherein the means for generating each of the first and second fundamental signals comprises at least one voltage controlled oscillator, each voltage controlled oscillator comprising:
a first transistor with a source connected to the first fundamental signal terminal, a gate, and a drain connected to a first power supply voltage source;
a second transistor with a source connected to the second fundamental signal terminal and the gate of the first transistor, a gate connected to the source of the first transistor, and a drain connected to the first power supply voltage source;
a frequency determining element connected between the source of the first transistor and the source of the second transistor, said frequency determining element governing a fundamental frequency of each voltage controlled oscillator;
a third transistor with a source connected to a ground reference voltage, a drain connected to first output terminal, a gate connected to the input control signal terminal, and a source connected to a second power supply voltage source; and
a fourth transistor with a source connected to a ground reference voltage, a drain connected to second output terminal, a gate connected to the input control signal terminal, and a source connected to the second power supply voltage source;

wherein the input control signal sets a conductance of the third and fourth transistors to control the frequency of the first and second fundamental signals to provide a phase/frequency modulation of said first and second fundamental signals.

77. The apparatus for power amplification and modulation of claim 67 further comprising:

means for receiving an amplitude modulation signal; and means for modulating an amplitude of each of the first and second fundamental signals correlated to the amplitude modulation signal.

78. The apparatus for power amplification and modulation of claim 77 wherein means for generating each of the first and second fundamental signals comprises at least one voltage controlled oscillator, each voltage controlled oscillator comprising:

a first amplification device with a source terminal connected to the first output signal terminal, a gate terminal, a drain terminal connected to a first power supply voltage source, and an amplitude modulation control terminal that receives the amplitude modulation signal that controls a transconductance factor of said first amplification device;

a second amplification device with a source terminal connected to the second output signal terminal and the gate terminal of the first amplification device, a gate terminal connected to the source terminal of the first amplification device, a drain terminal connected to the first power supply voltage source, and an amplitude modulation control terminal that receives the amplitude modulation signal that controls a transconductance factor of said second amplification device; and a frequency determining element connected between the source terminal of the first amplification and the source of the second amplification device, said frequency determining element governing a fundamental frequency of each voltage controlled oscillator;

wherein the transconductance factor of the first and second amplification devices controls an amplitude of each of the first and second fundamental signals to provide an amplitude modulation of said first and second fundamental signals.

79. The apparatus for power amplification and modulation of claim 78 wherein each voltage controlled oscillator further comprises:

a third amplification device with a source terminal connected to a ground reference voltage, a drain terminal connected to first output terminal, a gate connected to the input control signal terminal, and an amplitude modulation control terminal that receives the amplitude modulation signal that controls a transconductance factor of said third amplification device; and a fourth amplification device with a source terminal connected to the second power supply voltage source, a drain terminal connected to second output terminal, a gate terminal connected to the input control signal terminal, and an amplitude modulation control terminal that receives the amplitude modulation signal that controls a transconductance factor of said first amplification device;

wherein the input control signal sets a conductance of the third and fourth amplification devices to control the frequency of the first and second output signals to provide a phase/frequency modulation of said first and second output signals.

80. The apparatus for power amplification and modulation of claim 79 wherein the third and fourth amplification devices each comprise:

a second plurality of parallel transistors, whereby each transistor has a gate connected to the gate terminal, a drain connected to the drain terminal, and a drain;

a second plurality of switching devices with a first terminal connected to the source terminal, a second terminal connected the sources of all of the second plurality of parallel transistors excepting a first transistor of the second plurality of parallel transistors, and a control terminal to control the amplitude modulation of the first and second fundamental signals;

wherein the source of the first transistor of the second plurality of parallel transistors is connected to the source terminal; and a second modulation control device connected to amplitude modulation control terminal, receives the amplitude modulation signal, interprets said amplitude modulation signal to selectively activate any of the second plurality of switching devices to connect the drains of the selected parallel transistors to the drain terminal and modifies said transconductance factor.

81. The apparatus for power amplification and modulation of claim 78 wherein the first and second amplification devices each comprise:

a first plurality of parallel transistors, whereby each transistor has a gate connected to the gate terminal, a source connected to the source terminal, and a drain;

a first plurality of switching devices with a first terminal connected to the drain terminal, a second terminal connecting the drains of all of the first plurality of parallel transistors excepting a first transistor of the first plurality of parallel transistors, and a control terminal to control the amplitude modulation of the first and second fundamental signals;

wherein the drain of the first transistor of the first plurality of parallel transistors is connected to the drain terminal; and a first modulation control device connected to amplitude modulation control terminal to receive the amplitude modulation signal, interpret said amplitude modulation signal to selectively activate any of the plurality of switching devices to connect the drains of the selected parallel transistors to the drain terminal and modify said transconductance factor.

82. An apparatus for power amplification and modulation of a fundamental signal to provide a high power output signal comprising:

means for generating a plurality of first fundamental signals;

means for providing an input control signal to phase/frequency modulate said first fundamental signals;

means for generating a plurality of phase synchronizing control signals from said first fundamental signals to phase synchronize said first fundamental signals;

means for buffering said modulated and synchronized first fundamental signals, said buffering comprising:

means for amplifying and conditioning said modulated first fundamental signals; and means for combining said amplified and conditioned first fundamental signals to generate said high power output signal.

83. The apparatus for power amplification and modulation of claim 82 further comprises:
  means for generating a plurality second fundamental signals;
  means for phase/frequency modulating said second fundamental signals; and
  means for synchronizing a phase of each first and second fundamental signal such that each first and second fundamental signal has an identical phasing.

84. The apparatus for power amplification and modulation of claim 83 further comprising:
  means for buffering said modulated second fundamental signals, said buffering comprising:
    means for amplifying and conditioning said modulated second fundamental signal.

85. The apparatus for power amplification and modulation of claim 84 further comprising means for combining said amplified and conditioned first and second fundamental signal to generate said high power output signal.

86. The apparatus for power amplification and modulation of claim 84 further comprising:
  means for receiving an amplitude modulation signal; and
  means for modulating an amplitude of each of the first and second fundamental signals correlated to the amplitude modulation signal.

87. The apparatus for power amplification and modulation of claim 83 wherein means for generating each of the first and second fundamental signals comprising a plurality of voltage controlled oscillator, each voltage controlled oscillator comprising:
  a first transistor with a source connected to the first fundamental signal terminal, a gate, and a drain connected to a first power supply voltage source;
  a second transistor with a source connected to the second fundamental signal terminal and the gate of the first transistor, a gate connected to the source of the first transistor, and a drain connected to the first power supply voltage source;
  a frequency determining element connected between the source of the first transistor and the source of the second transistor, said frequency determining the element governing a fundamental frequency of each voltage controlled oscillator;
  a third transistor with a source connected to a ground reference voltage, a drain connected to first output terminal, a gate, and a source connected to a second power supply voltage source; and
  a fourth transistor with a source connected to a ground reference voltage, a drain connected to second output terminal, a gate, and a source connected to the second power supply voltage source;
  wherein the input control signal sets a conductance of the third and fourth transistors to control the frequency of the first and second fundamental signals to provide a phase/frequency modulation of said first and second fundamental signals.

88. The apparatus for power amplification and modulation of claim 87 wherein means for synchronizing the phase of the first and second fundamental signals comprises a phase control circuit, said phase control circuit comprising a plurality of buffer amplifiers, each buffer amplifier including an input terminal and an output terminal such that a signal presented to said input terminal is transferred to said output terminal,
  wherein a pair of the plurality of voltage controlled oscillators have four of the plurality of buffer amplifiers installed between them, such that:
    the input terminal of a first buffer amplifier of said four buffer amplifiers is connected to the first output terminal of a first of said pair of voltage controlled oscillators and the output of said first buffer amplifier is connected to the gate of the third transistor of a second voltage controlled oscillator of the pair of voltage controlled oscillators,
    the input terminal of a second buffer amplifier of said four buffer amplifiers is connected to the first output terminal of the second of said pair of voltage controlled oscillators and the output of said second buffer amplifier is connected to the gate of the third transistor of a first voltage controlled oscillator of the pair of voltage controlled oscillators,
    the input terminal of a third buffer amplifier of said four buffer amplifiers is connected to the second output terminal of the first of said pair of voltage controlled oscillators and the output of said third buffer amplifier is connected to the gate of the fourth transistor of the second voltage controlled oscillator of the pair of voltage controlled oscillators, and
    the input terminal of a fourth buffer amplifier of said four buffer amplifiers is connected to the second output terminal of the second voltage controlled oscillator of said pair of voltage controlled oscillators and the output of said second buffer amplifier is connected to the gate of the fourth transistor of a first voltage controlled oscillator of the pair of voltage controlled oscillators.

89. The apparatus for power amplification and modulation of claim 88 wherein an input control signal terminal of a master voltage controlled oscillator of said plurality of voltage controlled oscillators is connected to the gates of the third and fourth transistors of said master voltage controlled oscillator to provide a control signal to control the phase/frequency of said master voltage controlled oscillator and thus the phase of the plurality of voltage controlled oscillators.

90. The apparatus for power amplification and modulation of claim 88 wherein means for generating each of the first and second fundamental signals a plurality of a voltage controlled oscillators, each voltage controlled oscillator comprising:
  a first amplification device with a source terminal connected to the first output signal terminal, a gate terminal, a drain terminal connected to a first power supply voltage source, and an amplitude modulation control terminal that receives the amplitude modulation signal that controls a transconductance factor of said first amplification device;
  a second amplification device with a source terminal connected to the second output signal terminal and the gate terminal of the first amplification device, a gate terminal connected to the source terminal of the first amplification device, a drain terminal connected to the first power supply voltage source, and an amplitude modulation control terminal that receives the amplitude modulation signal that controls a transconductance factor of said second amplification device; and
  a frequency determining element connected between the source terminal of the first amplification and the source of the second amplification device, said frequency determining element governing a fundamental frequency of each voltage controlled oscillator;
  wherein the transconductance factor of the first and second amplification devices controls an amplitude of each of the first and second fundamental signals to provide an amplitude modulation of said first and second fundamental signals.

91. The apparatus for power amplification and modulation of claim 90 wherein each voltage controlled oscillator further comprises:
   a third amplification device with a source terminal connected to a ground reference voltage, a drain terminal connected to first output terminal, a gate connected to the input control signal terminal, and an amplitude modulation control terminal that receives the amplitude modulation signal that controls a transconductance factor of said third amplification device; and
   a fourth amplification device with a source terminal connected to the second power supply voltage source, a drain terminal connected to second output terminal, a gate terminal connected to the input control signal terminal, and an amplitude modulation control terminal that receives the amplitude modulation signal that controls a transconductance factor of said first amplification device;
   wherein the input control signal sets a conductance of the third and fourth amplification devices to control the frequency of the first and second output signals to provide a phase/frequency modulation of said first and second output signals.

92. The apparatus for power amplification and modulation of claim 90 wherein the first and second amplification devices each comprise:
   a first plurality of parallel transistors, whereby each transistor has a gate connected to the gate terminal, a source connected to the source terminal, and a drain;
   a first plurality of switching devices with a first terminal connected to the drain terminal, a second terminal connecting the drains of all of the first plurality of parallel transistors excepting a first transistor of the first plurality of parallel transistors, and a control terminal to control the amplitude modulation of the first and second fundamental signals;
   wherein the drain of the first transistor of the first plurality of parallel transistors is connected to the drain terminal; and
   a first modulation control device connected to amplitude modulation control terminal to receive the amplitude modulation signal, interpret said amplitude modulation signal to selectively activate any of the plurality of switching devices to connect the drains of the selected parallel transistors to the drain terminal and modify said transconductance factor.

93. The apparatus for power amplification and modulation of claim 92 wherein means for buffering the first and second fundamental signals comprising at least one buffer circuit, each buffer circuit is comprised of an input terminal and an output terminal, said input terminal receiving the first or second fundamental signal, said buffer circuit amplifying and conditioning said first or second fundamental signal, and transmitting said amplified and conditioned first or second output signal from said output terminal.

94. The apparatus for power amplification and modulation of claim 83 further comprising:
   means for receiving an amplitude modulation signal; and
   means for modulating an amplitude of each of the first and second fundamental signals correlated to the amplitude modulation signal.

95. The apparatus for power amplification and modulation of claim 94 wherein the third and fourth amplification devices each comprise:
   a second plurality of parallel transistors, whereby each transistor has a gate connected to the gate terminal, a drain connected to the drain terminal, and a drain;
   a second plurality of switching devices with a first terminal connected to the source terminal, a second terminal connected the sources of all of the second plurality of parallel transistors excepting a first transistor of the second plurality of parallel transistors, and a control terminal to control the amplitude modulation of the first and second fundamental signals;
   wherein the source of the first transistor of the second plurality of parallel transistors is connected to the source terminal; and
   a second modulation control device connected to an amplitude modulation control terminal, receives the amplitude modulation signal, interprets said amplitude modulation signal to selectively activate any of the second plurality of switching devices to connect the drains of the selected parallel transistors to the drain terminal and modify said transconductance factor.

96. The apparatus for power amplification and modulation of claim 95 wherein means for modulating the amplitude of each of said first and second fundamental signals comprises an amplitude modulation circuit connected between the first power supply voltage source and the buffer circuits to adjust an amplifying factor of the pluralities of the buffer circuits to provide an amplitude modulation of said output signal dependent upon the amplitude modulation signal.

97. The apparatus for power amplification and modulation of claim 96 wherein said high power output signal is determined by the formula:

$$AMS = \cos\theta * \sin\omega t = [\sin(\omega t+\theta)+\sin(\omega t-\theta)]\tfrac{1}{2}$$

where:
   AMS is the amplitude modulated high power output signal;
   $\cos\theta$ is the amplitude of the amplitude modulation signal and $\theta$ is said delay factor; and
   $\sin\omega t$ is the amplitude of said output signal of each voltage controlled oscillator.

98. The apparatus for power amplification and modulation of claim 96 wherein said high power output signal is determined by the formula:

$$AMS = \sin\theta * \sin\omega t = [\sin(\omega t+\theta)-\sin(\omega t-\theta)]-\tfrac{1}{2}$$

where:
   AMS is the amplitude modulated high power output signal;
   $\sin\theta$ is the amplitude of the amplitude modulation signal and $\theta$ is said delay factor; and
   $\sin\omega t$ is the amplitude of said output signal of each voltage controlled oscillator.

99. The apparatus for power amplification and modulation of claim 95 wherein means for modulating the amplitude of each of said first and second fundamental signals comprises an amplitude modulation circuit connected to the buffer circuits to adjust a delay factor of the buffer circuits to provide an amplitude modulation of said output signal dependent upon the amplitude modulation signal.

* * * * *